(12) United States Patent
Smith

(10) Patent No.: US 6,291,896 B1
(45) Date of Patent: *Sep. 18, 2001

(54) FUNCTIONALLY SYMMETRIC INTEGRATED CIRCUIT DIE

(75) Inventor: John Stephen Smith, Berkeley, CA (US)

(73) Assignee: Alien Technology Corporation, Morgan Hill, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 30 days.

(21) Appl. No.: 09/251,220

(22) Filed: Feb. 16, 1999

(51) Int. Cl.[7] .......................... H01L 23/48; H01L 23/52; H01L 29/40
(52) U.S. Cl. ............................. 257/786; 257/693
(58) Field of Search .................... 257/786, 693, 257/698, 701, 685, 686; 361/761, 764; 438/107, 109, 108, 114, 110

(56) References Cited

U.S. PATENT DOCUMENTS

| | | |
|---|---|---|
| 4,677,528 * | 6/1987 | Miniet . |
| 4,817,850 | 4/1989 | Wiener-Avnear et al. .......... 228/119 |
| 5,032,896 * | 7/1991 | Little et al. . |
| 5,138,436 * | 8/1992 | Keopf . |
| 5,363,118 | 11/1994 | Okumura . |
| 5,447,886 * | 9/1995 | Rai . |
| 5,455,741 * | 10/1995 | Wai et al. . |
| 5,545,291 | 8/1996 | Smith et al. . |
| 5,572,211 | 11/1996 | Erhart et al. . |
| 5,585,676 | 12/1996 | Uda et al. ............................. 257/786 |
| 5,627,557 | 5/1997 | Yamaguchi et al. . |
| 5,719,591 | 2/1998 | Callahan, Jr. et al. . |
| 6,011,693 * | 1/2000 | Gore . |

FOREIGN PATENT DOCUMENTS

| | | |
|---|---|---|
| 0 747 948 A2 | 12/1996 | (EP) . |
| 59021055 | 2/1984 | (JP) . |

OTHER PUBLICATIONS

Cohn, MB and Kim, CJ: "Self–Assembling Electrical Networks: An Application of Micromachining Technology", *In Transducers '91: 1991 International Conference on Solid–State Sensors and Actuators: Digest of Technical Papers*, pp. 490–493, IEEE (1991).

* cited by examiner

*Primary Examiner*—Sheila V. Clark
(74) *Attorney, Agent, or Firm*—Blakely, Sokoloff, Taylor & Zafman

(57) ABSTRACT

A functionally symmetric integrated circuit die to be mounted into a mutually symmetric receptor site. In one embodiment, a functionally symmetric integrated circuit die includes a substrate and a plurality of interface pads arranged thereon. The plurality of interface pads couple integrated circuitry disposed in the substrate to a plurality of interface pads of a mutually symmetric receptor site of an electronic device. The integrated circuit die can be mounted into the receptor site in any of a plurality of rotational orientations relative to the receptor site. The plurality of interface pads on the integrated circuit die and the receptor site are arranged such that an electronic device functions with the integrated circuit die in mounted in the receptor site in any one of the plurality of orientations.

80 Claims, 19 Drawing Sheets

FUNCTIONALLY SYMMETRIC INTEGRATED CIRCUIT DIE

RELATED APPLICATIONS

This application is related to co-pending application Ser. No. 09/251,268, filed Feb. 16, 1999, entitled "Pixel Integrated Circuit," which is assigned to the Assignee of the instant application.

This application is also related to co-pending application Ser. No. 09/251,269, filed Feb. 16, 1999, entitled "Testing Integrated Circuit Dice," which is assigned to the Assignee of the instant application.

BACKGROUND OF THE INVENTION

1. Field of the Invention

The present invention relates generally to the field of electronic devices and, more specifically, the present invention relates to integrated circuits.

2. Background Information

There is currently a need in industry for a cost-effective, efficient and practical method for producing large arrays of electronic elements that can provide, produce or detect voltages. One example of such a need is that of displays, where each voltage becomes a subpixel intensity. Flat panel displays (FPDs) have become a multibillion dollar industry and is presently a growing portion of the high-resolution display market, which is itself growing rapidly. Liquid crystal displays (LCDs) dominate the FPD marketplace. One type of FPD is the active matrix LCDs or active matrix displays. Active matrix displays have a substantial worldwide infrastructure and are a proven commercial technology.

Each picture element or pixel of an active matrix LCD contains one or more thin film transistors. The presence of these active elements make it possible to more clearly and precisely control the brightness of each pixel, which dramatically improves the quality of the display. The advantages of active matrix LCDs become more pronounced as the screen sizes and resolutions increase. However, as screen sizes and resolutions increase, the manufacture and production of active matrix LCDs become increasingly difficult because is challenging to produce active matrix LCDs with high yields. For example, if a particular active matrix LCD has an unacceptably large number of defects, such as for example defective transistors or pixels, the entire active matrix LCD is discarded even though a relatively small number of elements are defective compared to the total number of elements on the active matrix LCD.

One concern with the increasing size of large arrays of electronic elements is that as the number of electronic elements in the array increases, the lower the probability that all of elements in the array will work properly. With existing techniques, it is difficult to test any of the elements until the assembly is complete. If there are imperfections in the array, the imperfections must be tolerated. Otherwise, the entire array must be discarded, or special and expensive techniques must be used to repair the imperfections in the array.

Silicon very large scale integration (VLSI) processes may be used to produce an array of electronic elements over a silicon wafer surface. A disadvantage with using these processes is that silicon wafers are conductive, limited in size and are generally not transparent. Furthermore, large areas of processed silicon wafers can be expensive. In particular, displays that valve the light coming through them need to be largely transparent. Single crystal silicon can be bonded to a glass substrate, and then etched to remove most of the area to achieve transparency, but this is intrinsically wasteful in that, for the sake of maximizing light transmission, the majority of the processed material is discarded, and becomes chemical waste. The underutilization of the precious die area wastes resources, causes greater amounts of chemical waste to be generated in the process, and is generally inefficient and expensive.

There are of course countless other examples of arrays of electronic elements that have useful applications. Another example of such an array is a photodiode array to collect solar energy. Large arrays of silicon photodiodes with concentrating lenses have been made by sawing wafers and using pick and place assembly, but thermal dissipation is poor for large elements, and small elements required too much assembly time.

Thus, what is desired are methods and apparatuses for fabricating and testing arrays of electronic elements.

SUMMARY OF THE INVENTION

In one embodiment, methods and apparatuses providing functionally symmetric integrated circuit dice are disclosed. In one embodiment, an integrated circuit die is disclosed that includes a substrate and a plurality of interface pads to couple the integrated circuit die to receptor site of an electronic device. The plurality of interface pads of the integrated circuit die are arranged in the substrate such that the electronic device operates with the integrated circuit die mounted to the receptor site in any one of a plurality of orientations relative to the receptor site.

In another embodiment, methods and apparatuses providing integrated circuits for display pixels are disclosed. In one embodiment, an integrated circuit device is disclosed that includes a first transistor coupled between an input and a first pixel of a display. The first transistor is configured to couple the first pixel to receive an input signal from the input in response to a first select signal. The integrated circuit device also includes a second transistor coupled between the input and the first transistor. The second transistor is configured to couple the first transistor to receive the input signal in response to a second select signal.

In yet another embodiment, methods and apparatuses for testing integrated circuit dice are disclosed. In one embodiment, a method for testing a plurality of integrated circuits is disclosed to include the steps of arranging a plurality of integrated circuits on a wafer. The plurality of integrated circuits includes a first integrated circuit arranged on the wafer adjacent to a second integrated circuit. A first end of a switchable coupling of the first integrated circuit is coupled across the boundary region of the wafer to a first end of a switchable coupling of the second integrated circuit. A switchable coupling is verified between a second end of the switchable coupling of the first integrated circuit and a second end of the switchable coupling of the second integrated circuit across the boundary region of the wafer. The first integrated circuit is then separated from the second integrated circuit by separating the wafer at the boundary region. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

Methods and apparatuses for providing arrays of integrated circuits in electronic devices are disclosed. In the following description, numerous specific details are set forth in order to provide a thorough understanding of the present invention. It will be apparent, however, to one having ordinary skill the art that the specific detail need not to be employed to practice the present invention. In other instances, well-known materials or methods have not been described in order to avoid obscuring the present invention.

In one embodiment, the present invention relates to a design and a series of steps and a resulting structure for forming an array of active devices on a substrate which, by way of example, could be plastic, glass or a separately fabricated silicon substrate, among others. One embodiment of the present invention provides arrays of elements that can be, for example, individually addressed, driven to a particular voltage or electrically measured. Examples of array structures to which the present invention may be applied include, but are not limited to, displays, x-ray detector panels, solar cell arrays, memory arrays, long wavelength detector arrays, phased arrays of antennas, or the like.

In another embodiment of the present invention, electronic subelements including small integrated circuit dice that are functionally symmetric under specific rotations are utilized. In one embodiment, the individual integrated circuit dice have a trapezoidal cross section. The trapezoidal cross section of one embodiment help the individual integrated circuit dice to be mounted into receptor sites of another substrate of an electronic device using for example fluidic or vibrational random placement.

For instance, in one embodiment, integrated circuits may be formed using conventional VLSI techniques and then later separated into individual integrated circuit dice by micro-machining into separate elements. In so doing, the integrated circuits may be designed in one embodiment in a way that enables them to be tested before assembly, so that any defective elements can be discarded.

In one embodiment, the successfully tested integrated circuit dice are later mounted in an array onto another substrate, which may be formed from many different materials such as for example but not limited to plastic, glass, metal and others, or in layers of one material on another, such as for example plastic on a glass substrate.

In one embodiment, the design of the integrated circuit dice that are later mounted onto another substrate of electronic device includes features such that the process of interconnecting the elements of the array use only a single layer of metalization, thereby reducing the possibility of interlayer shorts on the array of the electronic device.

Figure 1:
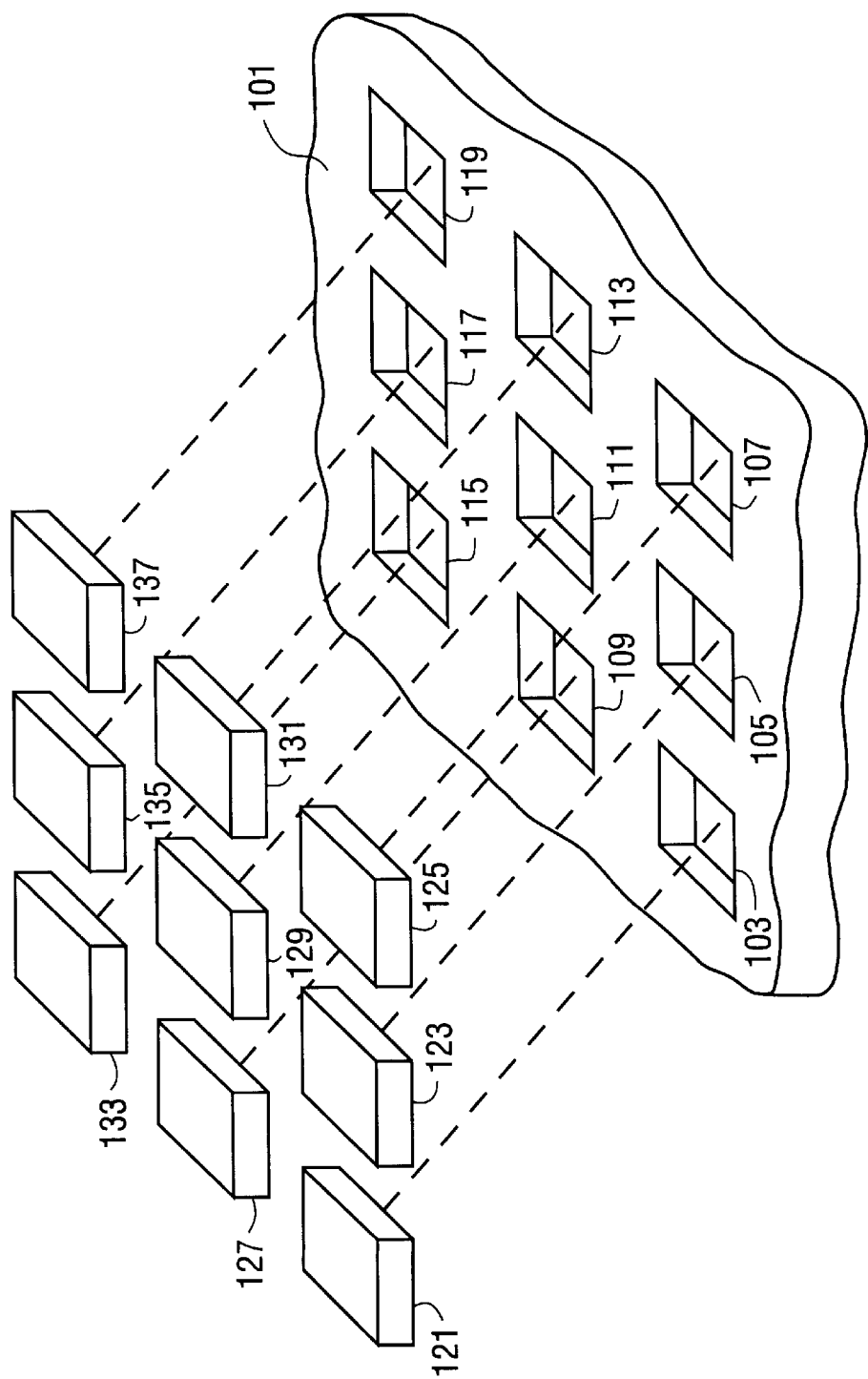
FIG. 1 is an illustration of one embodiment of an array of electronic elements that may be mounted into receptor sites of an electronic device in accordance with the teachings of the present invention.

FIG. 1 is an illustration of a portion of a substrate 101 of an electronic device having a plurality of receptor sites 103, 105, 107, 109, 111, 113, 115, 117 and 119. As also shown in FIG. 1, a plurality of elements 121, 123, 125, 127, 129, 131, 133, 135 and 137 are each haped to be mounted into the receptor sites 103, 105, 107, 109, 111, 113, 115, 117 and 119. After the elements are mounted into the corresponding receptor sites, an array of electronic elements is realized in accordance with the teachings of the present invention.

In one embodiment, each of the elements including elements 121, 123, 125, 127, 129, 131, 133, 135 and 137 are individual integrated circuit dice that have been micro-machined and tested before being mounted into the receptor sites 103, 105, 107, 109, 111, 113, 115, 117 and 119. In one embodiment, each of the elements 121, 123, 125, 127, 129, 131, 133, 135 and 137 is functionally symmetric such that each one of the elements is interchangeable with another one of the elements. That is, the electronic device of substrate 101 would function properly independent of whether element 121 is ultimately mounted into receptor site 103, receptor site 105, receptor site 107, etc.

As will be discussed in greater detail below, in one embodiment of the present invention, each one of the elements 121, 123, 125, 127, 129, 131, 133, 135 and 137 is functionally symmetric over a plurality of rotational orientations. For example, in the embodiment illustrated in FIG. 1, the electronic device of substrate 101 would function properly if element 121 is mounted into receptor site 103 as shown. Furthermore, the electronic device of substrate 101 would also function properly if element 121 were rotated 90 degrees and mounted into receptor site 105, or if element 121 were rotated 270 degrees and mounted into receptor site 107, etc.

Figure 2:
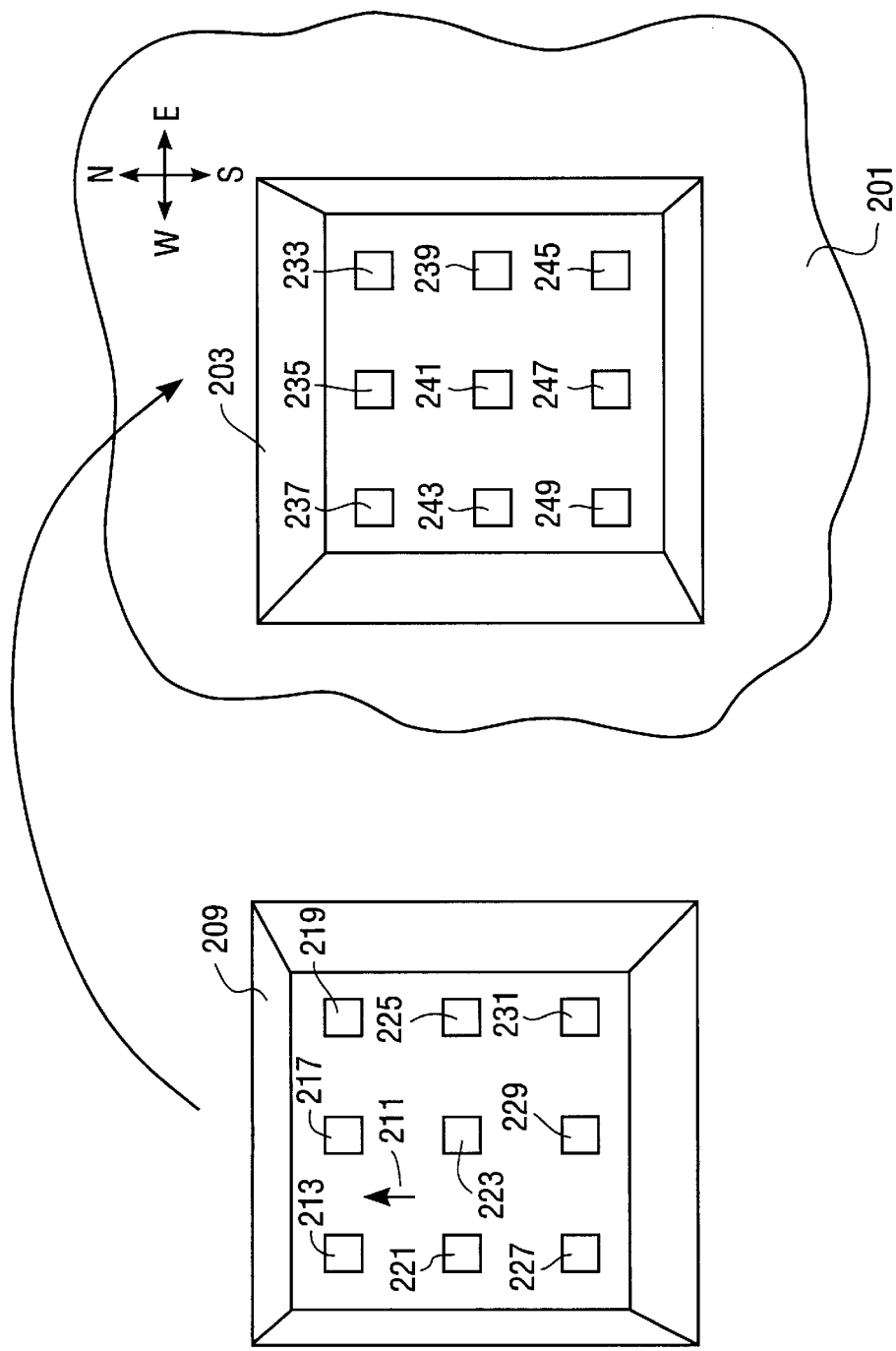
FIG. 2 is an illustration of one embodiment of a functionally symmetric integrated circuit die element having a plurality of interface pads and a corresponding mutually functionally symmetric receptor site having a plurality of corresponding interface pads.

FIG. 2 is an illustration of greater detail showing a receptor site 203 in a substrate 201 of an electronic device. FIG. 2 also shows an element 209 that is configured to be mounted into receptor site 203. As shown in FIG. 2, the cross section of element 209 in one embodiment of the present invention is trapezoidal. In one embodiment, the trapezoidal cross section of element 209 of the present invention help element 209 to be mounted into receptor site 203 using fluidic self-assembly, vibrational tables, or the like.

In one embodiment of the present invention, element 209 and receptor site 203 have physical shape that allow element 209 to be mounted in receptor site 203 in any one of a plurality of orientations relative to receptor site 203. For explanation purposes only, assume that the top of FIG. 2 is "North" and that arrow 211 is fixed on element 209 as shown in FIG. 2. In the embodiment illustrated in FIG. 2, element 209 and receptor site 203 each have four-fold or four degrees of symmetry. As can be appreciated to those skilled in the art, other shapes having other degrees of symmetry (e.g. two degrees of symmetry, three degrees of symmetry, etc.) may be utilized in accordance with the teachings of the present invention. In the example illustrated in FIG. 2, element 209 may be mounted in receptor site 203 with arrow 211 pointing "North," "East," "South" or "West."

In one embodiment, element 209 is an integrated circuit die on a substrate. In one embodiment, the integrated circuitry of element 209 is coupled to a plurality of interface pads 213, 217, 219, 221, 223, 225, 227, 229 and 231 arranged on one side of element 209. Similarly, there are a plurality of interface pads 233, 235, 237, 239, 241, 243, 245, 247 and 249 in receptor site 203 that are arranged to be coupled to the plurality of interface pads 213, 217, 219, 221, 223, 225, 227, 229 and 231 when element 209 is mounted in receptor site 203.

In one embodiment, element 209 and receptor site 203 are mutually symmetric such that element 209 can be mounted into receptor site 203 in any one of the plurality of orientations discussed above and the integrated circuit of element 209 will nevertheless provide the proper function for the electronic device of substrate 201. Therefore, in one embodiment of the present invention, each one of the plurality of interface pads 213, 217, 219, 221, 223, 225, 227, 229 and 231 are functionally symmetric and therefore provide a predetermined function for the integrated circuit of the element 209 independent of the orientation in which element 209 is mounted in receptor site 203. Therefore, the electronic device of substrate 201 will function properly with interface pad 213 coupled to either interface pad 233, 237, 249 or 245. It is observed that in the embodiment illustrated in FIG. 2, interface pad 223 of element 209 will be coupled to interface pad 241 of receptor site 203 in all of the possible orientations in which element 209 can be mounted to receptor site 203.

It is appreciated that there are a countless number of functions that the plurality of interface pads of element 209 can provide. It is also appreciated that other embodiments of the present invention may included a greater or a fewer number of interface pads, and may be arranged in different patterns in accordance with the teachings of the present invention. For example, in one embodiment, element 209 contains circuitry that couples interface pad 223 to interface pad 217 in response to interface pad 219. In one example embodiment, the circuitry of element 209 includes integrated circuit devices such as for example transistors that are coupled between the plurality of interface pads through vias. In another example embodiment, the circuitry of the element 209 couples interface pad 219 to interface pad 223 in response to interface pads 217 and 225. Depending on the particular embodiment of circuitry included in element 209, the interface pads in receptor site 203 can be coupled, driven, grounded, etc., accordingly.

Figure 3:
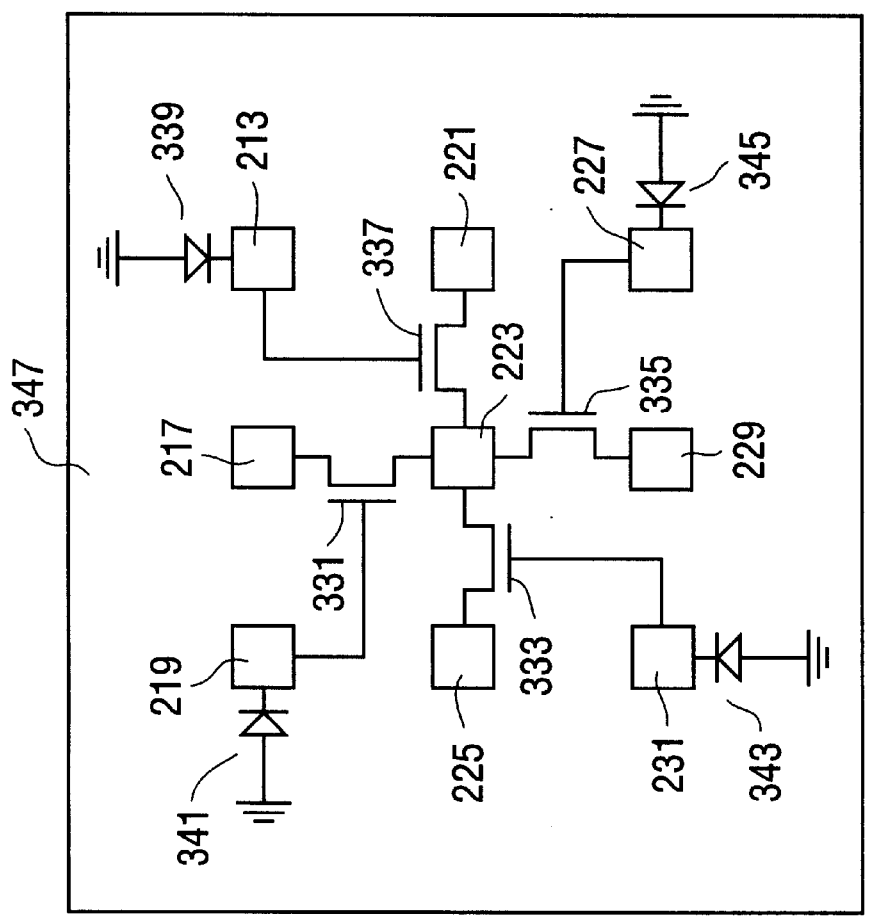
FIG. 3 is a schematic of one embodiment of an integrated circuit in accordance with the teachings of the present invention.

FIG. 3 is a schematic of one embodiment of an integrated circuit 301 that may be included in element 209 of FIG. 2 in accordance with the teachings of the present invention. As shown in FIG. 3, integrated circuit 301 includes a transistor 331 coupled between interface pads 223 and 227. A transistor 337 is coupled between interface pads 223 and 221. A transistor 335 is coupled between interface pads 223 and 229. A transistor 333 is coupled between interface pads 223 and 225. The gate of transistor 331 is coupled to interface pad 219. The gate of transistor 337 is coupled to interface pads 213. The gate of transistor 335 is coupled to transistor pad 227. The gate of transistor 333 is coupled to interface pad 231.

It is noted that transistors 331, 333, 335 and 337 are illustrated in FIG. 3 as N-channel field effect transistors. It is appreciated that in other embodiments of the present invention, other types of integrated circuit devices may be utilized in integrated circuit dice, such as for example but not limited to P-channel transistors, bipolar junction transistors, or the like. In one embodiment, and interface pads 213, 219, 231 and 227 are coupled to receive digital select signals. Since N-channel transistors are utilized in embodiment illustrated in FIG. 3, interface pad 217 is coupled to interface pad 223 in response to a logical "high" signal is received at interface pad 219. Similarly, interface pad 225 is coupled to the interface pad 223 when a logical "high" signal is received at interface pad 231. Interface pad 229 is coupled to interface pad 223 when a logical "high" signal is received at interface pad 227. Interface pad 221 is coupled to interface pad 223 when a logical "high" signal is received at interface pad 213.

In one embodiment of the present invention, integrated circuit 301 includes a diode 339 coupled to interface pad 213 and grounded to the substrate 347 of integrated circuit die 301. It is noted that substrate 347 is also shown as ground in integrated circuit die 301 in FIG. 3. A diode 341 is coupled to interface pad 219 and grounded to substrate 347. A diode 343 is coupled to interface pad 231 and grounded to substrate 347. In a diode 345 is coupled to interface pad 227 and grounded to substrate 347.

As discussed above with respect to FIG. 2, integrated circuit die 301 in one embodiment may be included in element 209, which is mounted in receptor site 203 of substrate 201 of an electronic device. In one embodiment of the present invention, it is assumed that at least one of interface pads 213, 219, 231 or 227 is at ground or zero volts during normal operation of the electronic device of substrate 201. In order to reduce the amount that the substrate 347 of integrated circuit die 301 "floats" above zero volts, at least one of diodes 339, 341, 343 or 345 will pull substrate 347 down to zero volts. For example, assume that substrate 347 rises to a voltage above ground and that interface pad 213 is at ground or zero volts. In this situation, diode 339 will "turn on" to maintain substrate 347 at ground. By maintaining substrate 347 at ground, it is appreciated that the risks of latch up or other undesirable consequences are reduced.

Figure 4:
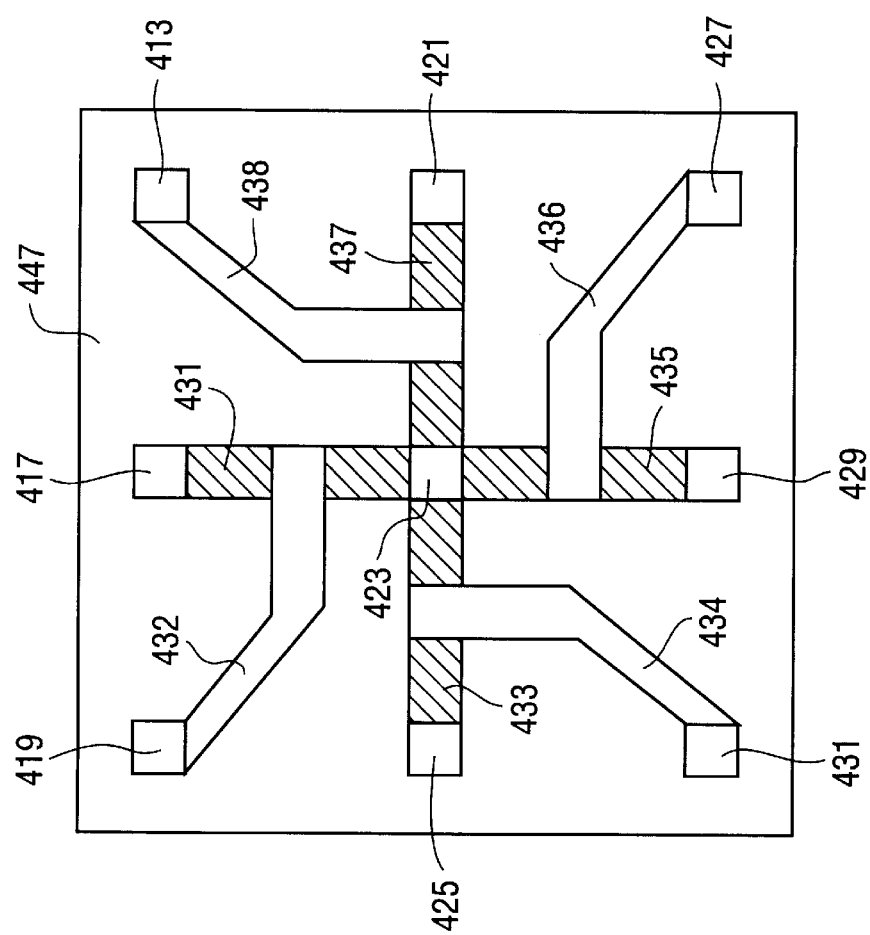
FIG. 4 is an illustration of one embodiment of a layout of an integrated circuit die in accordance of the teachings of the present invention.

FIG. 4 is an illustration showing one embodiment of a layout of integrated circuit die 401 in a substrate 447 in accordance with the teachings of the present invention. The layout of integrated circuit die 401 of FIG. 4 corresponds to the schematic illustrated in FIG. 3. In one embodiment, semiconductor substrate 447 includes silicon. In one embodiment, substrate 447 includes single crystal silicon. In one embodiment, vias 413, 417, 419, 421, 423, 425, 427, 429 and 491 of FIG. 4 are coupled to interface pads 213, 217, 219, 221, 223, 225, 227, 229 and 231, respectively, of FIGS. 2 and 3.

As shown in FIG. 4, a channel 431 is disposed in substrate 447 between vias 417 and 423. A channel 433 is disposed in substrate 447 between vias 425 and 423. A channel 435 is disposed in substrate 447 between vias 423 and 429. A channel 437 is disposed in substrate 447 between vias 423 and 421. As also shown in FIG. 4, a gate 432 is disposed over channel 431 and is coupled to via 419. A gate 434 is disposed over channel 433 and is coupled to via 431. A gate 436 is disposed over channel 435 and is coupled to via 427. A gate 438 is disposed over channel 437 and is coupled to via 413. In one embodiment, channel 431 and gate 432 of FIG. 4 form transistor 331 of FIG. 3. The channel 433 and gate 434 of FIG. 4 form transistor 333 of FIG. 3. The channel 435 and gate 436 of FIG. 4 form transistor 335 of FIG. 3. Channel 437 and gate 438 of FIG. 4 form transistor 337 of FIG. 3.

As one can observe from the illustration of FIG. 4, the layout of integrated circuit 401 has four degrees of symmetry, which happens to equal the number of degrees of symmetry of element 209 of FIG. 2. As will be discussed in greater detail below, other layouts having different degrees of symmetry than the corresponding element may be utilized in other embodiments in accordance with the teachings of the present invention.

Figure 5:
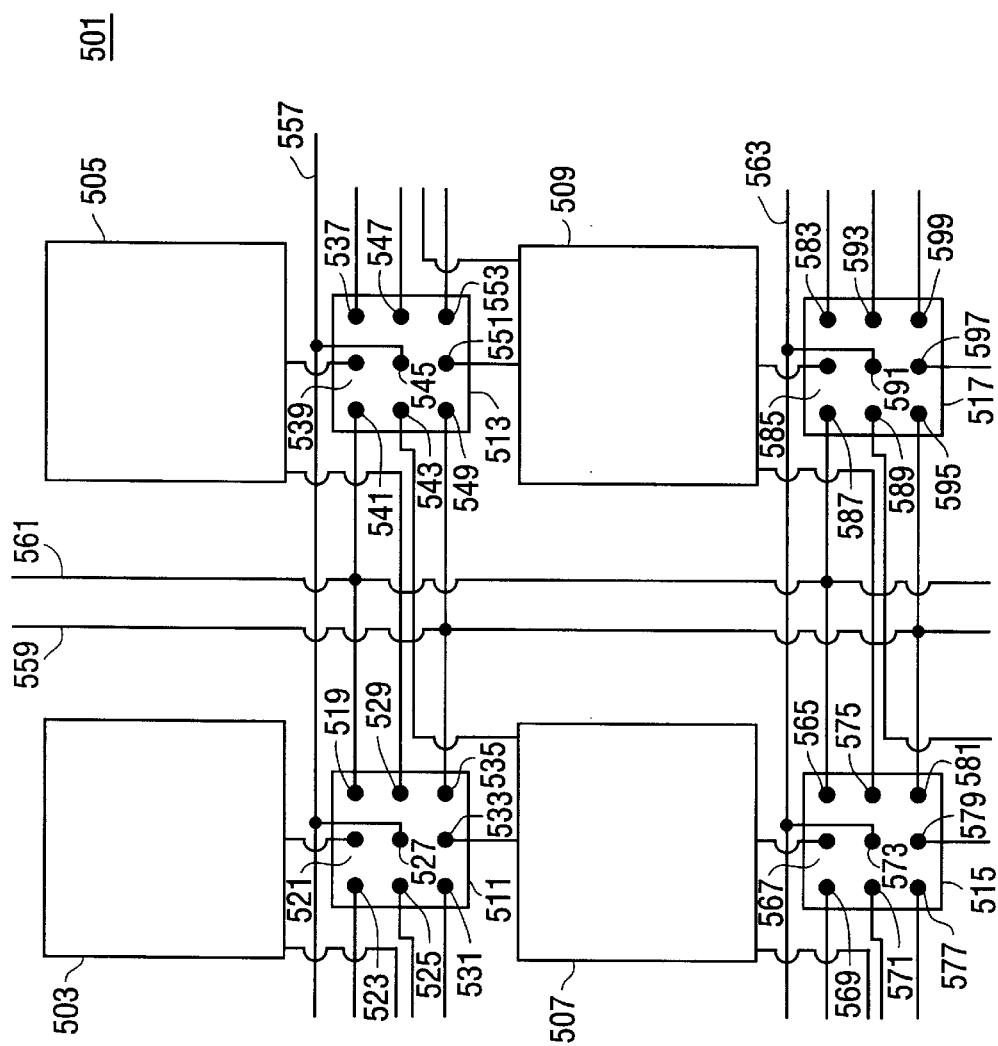
FIG. 5 is an illustration of one embodiment of a substrate of an active matrix display having a plurality of pixels and receptor sites in accordance with teachings of the present invention.

FIG. 5 is an illustration of one embodiment of a portion of a substrate 501 of electronic device. In one embodiment, the electronic device of substrate 501 is an active matrix display. As shown in FIG. 5, substrate 501 includes pixels 503, 505, 507 and 509 as well as receptor sites 511, 513, 515 and 517. In the embodiment illustrated in FIG. 5, receptor sites 511, 513, 515 and 517 are compatible with the integrated circuit dice discussed above with respect to FIGS. 2–4. For example, integrated circuit die 301 may be mounted to receptor sites 511 in any one of the above-discussed orientations because both integrated circuit die 501 and receptor site 511 have four degrees of symmetry.

In the embodiment illustrated, pixel 503 is coupled to interface pad 521 to receptor site 511. Pixel 505 is coupled to interface pad 539 of receptor site 513 and interface pad 529 a receptor site 511. Pixel 507 is coupled to interface pad 533 of receptor site 511, interface pad 549 of receptor site 513 and interface pad 567 of receptor site 515. Pixel 509 is coupled to interface pad 551 receptor site 513, interface pad 585 of receptor site 517 and interface pad 575 of receptor site 515.

Assuming that integrated circuit dice such as for example those discussed above with respect to FIGS. 2–4 are mounted into receptor sites 511, 513, 515 and 517, operation of the display of substrate 501 is as follows. As shown in FIG. 5, a digital column select line 559 is coupled to be received by interface pad 535 of receptor site 511, interface pad 549 of receptor site 513, interface pad 581 to receptor site 515 and interface pad 595 of receptor site 517. A digital column select line 561 is coupled to be received by interface pad 519 of receptor site 511, interface pad 541 of receptor site 513, interface pad 565 of receptor site 515 and interface pad 587 of receptor site 517. In one embodiment, digital column select lines 559 and 551 are used to activate an entire column of the display of substrate 501.

In one embodiment, analog row lines 557 and 563 are interconnects carrying analog pixel information for the pixels of the display. As shown in FIG. 5, analog row line 557 is coupled to interface pad 527 of receptor site 511 and interface pad 545 of receptor site 513. Analog row line 563 is coupled to interface pad 573 of receptor site 515 and interface pad 591 of receptor site 517.

Assume during operation of the active matrix display of substrate 501 that digital column select line 559 is set to logical low value and that digital column select line 551 is set to a logical high value. As a result, the column including pixels 505 and 509 is selected, while the column including pixels 503 and 507 is deselected. Accordingly, the analog signal on analog row line 557 is coupled to be received by pixel 505 through the interface pads 535 and 539 of receptor site 513. In addition, the analog signal on analog row line 557 is also coupled to be received by pixel 505 through interface pad 527 and 529 of receptor site 511. Similarly, the analog signal on row line 563 is coupled to be received by pixel 509 through the interface pads 591 and 585 of receptor site 517. In addition, the analog signal on row line 563 is also coupled to be received by pixel 509 through interface pads 573 and 575 of receptor site 515. It is noted that because column select 559 is at a logical low value, pixel 503 is not connected to row line 557 through interface pads 527 and 521 of receptor site 511. Similarly, pixel 507 is not coupled to row line 563 through interface pads 573 and 557 of receptor site 515. Indeed, pixels 503 and 507 are in a column that has not been selected with column select line 559.

It is noted that each pixel of the display illustrated in FIG. 5 is redundantly coupled to receive analog row information through a plurality of receptor sites in accordance with the teachings of the present invention. It is appreciated that this redundancy provides additional reliability to the display of substrate 501 in the event that there is a failure in an integrated circuit device that is included in one of the elements mounted in receptor sites 511, 513, 515 or 517.

Another characteristic of the display of substrate 501 is that whenever a column the selected using, for example, digital column select line 559 or 561, the entire column of the display is selected. Therefore, in one embodiment, row driver circuitry is required to drive pixel in the entire selected column of the display at a time. For large displays, this may amount to a substantial amount of circuitry to drive every pixel in the column of the display at a time.

Figure 6:
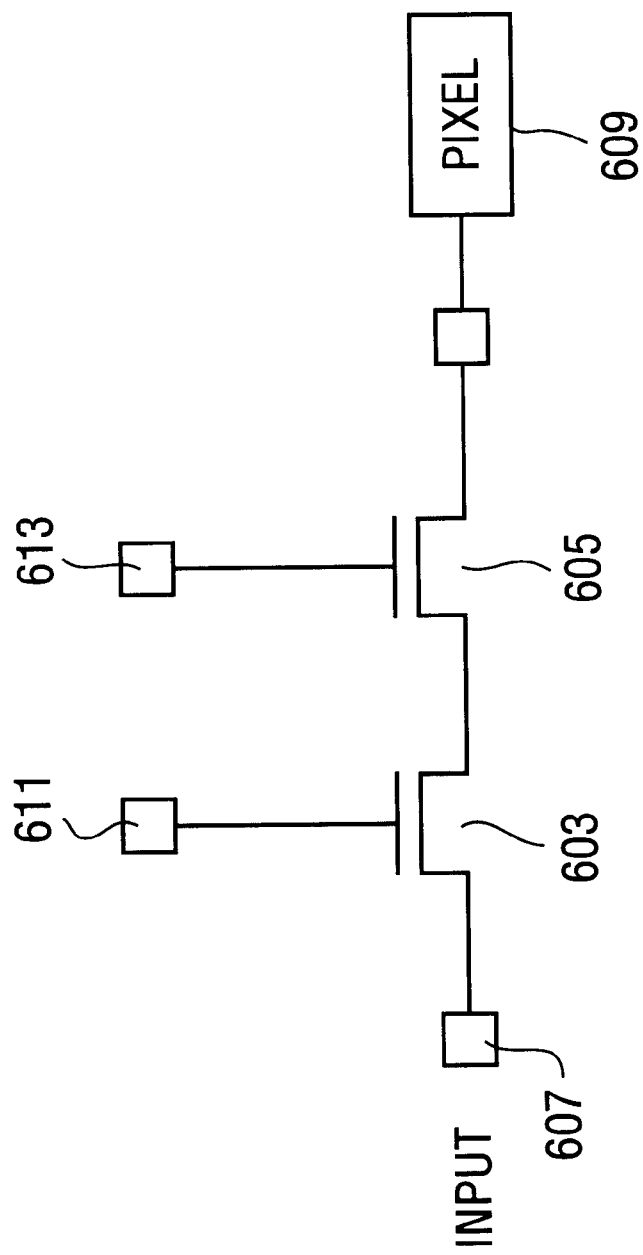
FIG. 6 is a schematic of one embodiment of an example circuit in accordance with the teachings of the present invention.

FIG. 6 is a schematic of another embodiment of integrated circuit 601 in accordance with the teachings of the present invention. In one embodiment, integrated circuit 601 includes series coupled transistors 603 and 605 between an input 607 and a pixel 609 of a display. As shown in FIG. 6, the gate of transistor 603 is coupled to receive a first digital select signal 611 and the gate of transistor 605 is coupled to receive a second digital select signal 613. Thus, in one embodiment, an analog input signal is received at input 607 and is coupled to pixel 605 in response to first and second digital select signals 611 and 613.

In one embodiment, digital select signal 611 is a row select signal and digital select signal 613 is a column select signal. In another embodiment, digital select signal 611 is a column select signal and digital select signal 613 is a row select signal.

With integrated circuit 601, it is noted that each individual pixel 609 of the display may be individually addressed. Therefore, it is appreciated that in one embodiment well-known multiplexing techniques may be utilized such that a smaller amount of row driver circuitry is used to drive each pixel 609 of the display in comparison with displays that utilize only a single digital select signal for each pixel.

For example, in one embodiment, the odd columns of pixels are driven during a first pass of a display refresh cycle and the remaining even columns of pixels are driven during the latter pass of the display refresh cycle. Accordingly, only half the amount of the row driver circuitry is utilized when compared to a display where all columns of pixels are driven during the same pass of a display refresh cycle. It is appreciated of course that there may be other combinations grouping pixels of a display for refresh in accordance with the teachings of the present invention. For instance, the pixels may be divided into odd/even columns of pixels, or the display may be divided into several regions, each of which may be refreshed individually in sequence, etc.

Figure 7:
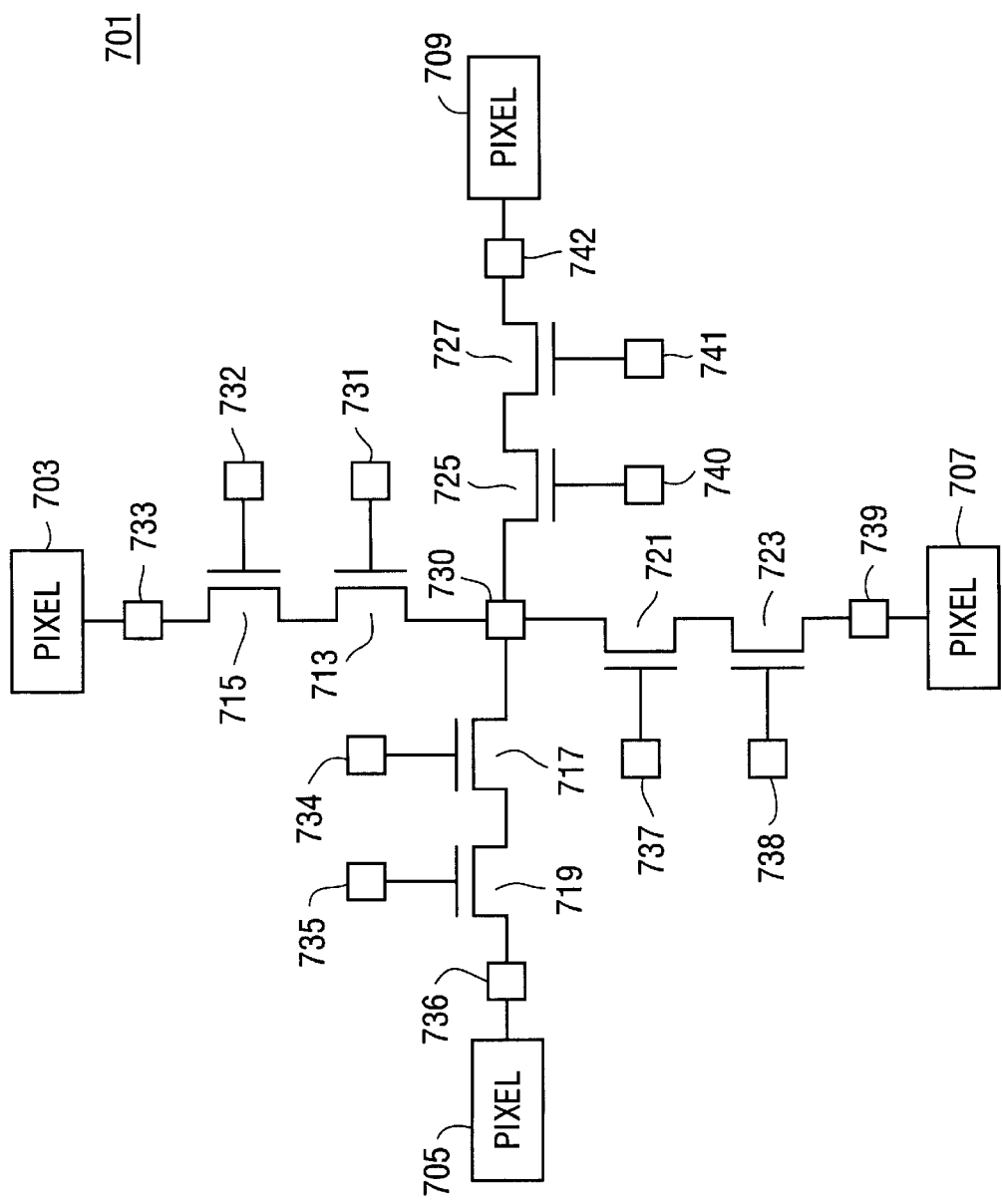
FIG. 7 is a schematic of yet another embodiment of an integrated circuit in accordance with the teachings of the present invention.

FIG. 7 is a schematic of yet another embodiment of integrated circuit 701 in accordance with the teachings of the present invention. As shown in FIG. 7, transistors 713 and 715 are coupled in series between interface pads 730 and 733. Transistors 717 and 719 are coupled in series between interface pads 730 and 736. Transistors 721 and 723 are coupled in series between interface pads 730 and 739. Transistors 725 and 727 are coupled in series between interface pads 730 and 742.

In one embodiment, integrated circuit 701 is used to drive the pixels of a display. Thus, in one embodiment, pixel 703 is coupled to interface pad 733, pixel 705 is coupled to interface pad 736, pixel 707 is coupled to interface pad 739 and pixel 709 is coupled to interface pad In one embodiment, interface pad 733 is coupled to receive an analog input signal coupled to interface pad 730 through transistors 713 and 715 in response to the first digital select signal coupled to be received at interface pad 731 and a second digital select signal coupled to be received at interface pad 732. Interface pad 736 is coupled to receive the analog input signal coupled to interface pad 730 through transistors 717 and 719 in response to a first digital select signal coupled to be received at interface pad 734 and a second digital select signal coupled to be received at interface pad 735. Interface pad 739 is coupled to receive the analog input signal coupled to interface pad 730 through transistors 721 and 723 in response to a first digital select signal coupled to be received at interface pad 737 and a second digital select signal coupled to be received at interface pad 738. Interface pad 742 is coupled to receive the analog input signal coupled to interface pad 730 through transistors 725 and 727 in response to a first digital select signal coupled to interface pad 740 and a second digital select signal coupled to interface pad 741.

It is noted that integrated circuit 701 is yet another integrated circuit that may be implemented into an integrated circuit die having functional symmetry over a plurality of rotational orientations in accordance with the teachings of the present invention. In the embodiment illustrated in FIG. 7, integrated circuit 701 has four-fold symmetry and 13 separate interface pads 730–742.

Figure 8:
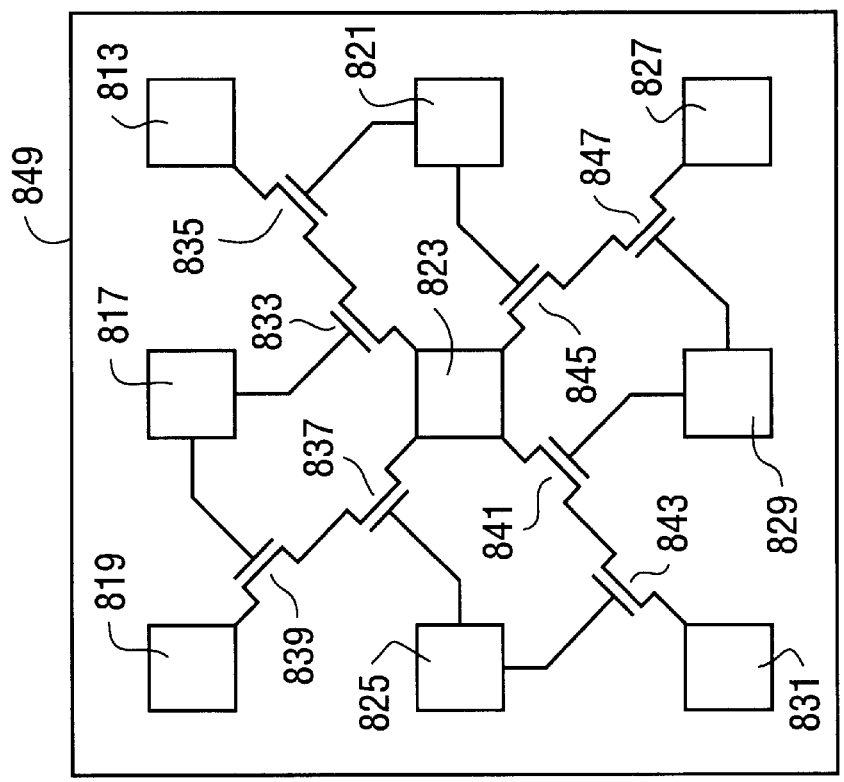
FIG. 8 is schematic of still another embodiment of integrated circuit in accordance with the teachings of the present invention.

FIG. 8 is a schematic of still another integrated circuit 801 in a substrate 849 providing two digital select signals for each pixel in accordance with the teachings of the present invention. It is appreciated that integrated circuit 801 may be included in an element similar to element 209 of FIG. 2 in accordance with the teachings of the present invention. In particular, interface pads 813, 817, 819, 821, 823, 825, 827, 839 and 831 of FIG. 8 correspond to interface pads 213, 217, 219, 221, 223, 225, 227, 229 and 231, respectively, of FIG. 2.

Integrated circuit 801 includes transistors 833 and 835 coupled in series between interface pads 823 and 813. Transistors 837 and 839 are coupled in series between interface pads 823 and 819. Transistors 841 and 843 are coupled in series between interface pads 823 and 831. Transistors 845 and 847 are coupled in series between interface pads 823 and 827. As shown in FIG. 8, the gates of transistors 833 and 839 are both coupled to interface pad 817. The gates of transistors 837 and 843 are both coupled to interface pad 825. The gates of transistors 841 and 847 are both coupled to interface pad 829. The gates of transistors 845 and 835 are both coupled to interface pad 821.

Accordingly, transistors 833 and 839 are switched in response to a digital select signal received at interface pad 817. Transistors 837 and 843 are switched in response to a digital select signal received at interface pad 825. Transistors 841 and 847 are switched in response to a digital select signal received at interface pad 829 transistors 835 and 845 are switched in response to a digital select signal received at interface pad 821.

Therefore, interface pad 813 is coupled to interface pad 823 in response to a logical high digital select signal received at interface pads 817 and 821. Interface pad 819 is coupled to interface pad 823 in response to the logical high digital select signal received at interface pads 817 and 825. Interface pad 831 is coupled to interface pad 823 in response to a logical high digital select signal received at interface pads 825 and 829. Interface pad 827 is coupled to interface pad 823 in response to a logical high digital select signal received at interface pads 821 and 829.

Assuming that integrated circuit 801 is utilized in one embodiment to drive pixels of an active matrix display from an analog signal line coupled to interface pad 823, it is worthwhile to note that integrated circuit 801 provides the individual addressability of pixels coupled to interface pads 813, 819, 827 and 831 using nine interface pads 813, 817, 819, 821, 823, 825, 827, 829 and 831 instead of the 13 interface pads 730–742 employed in FIG. 7.

Figure 9:
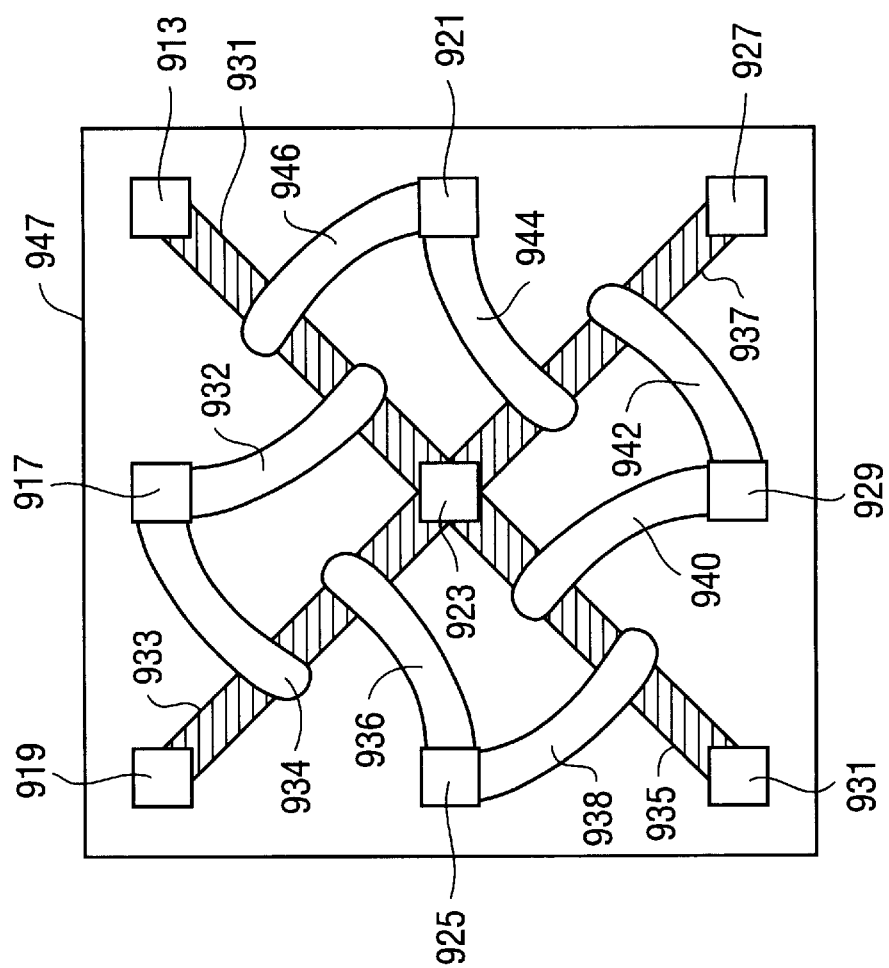
FIG. 9 is an illustration of another embodiment of a layout of an integrated circuit die in accordance with the teachings of the present invention.

FIG. 9 is an illustration showing one embodiment of a layout of an integrated circuit die 901 in a substrate 947 in accordance with the teachings of the present invention. The layout of integrated circuit die 901 corresponds to the schematic illustrated in FIG. 8. In one embodiment, semiconductor substrate 947 includes silicon. In one embodiment, substrate 947 includes single crystal silicon. In one embodiment, vias 913, 917, 919, 921, 923, 925, 927, 929 and 931 are coupled to interface pads 813, 817, 819, 821, 823, 825, 827, 829 and 831, respectively, of FIG. 8.

As shown in FIG. 9, a channel 931 is disposed in substrate 947 between vias 913 and 923. A channel 933 is disposed in substrate 947 between vias 919 and 923. A channel 935 is disposed in substrate 947 between vias 931 and 923. A channel 937 is disposed in substrate 947 between vias 927 and 923.

As also shown in FIG. 9, gates 932 and 946 are disposed over channel 931. Gates 932 and 946 are coupled to vias 917 and 921, respectively. Gates 936 and 934 are disposed over channel 933. Gates 936 and 934 are coupled to vias 925 and 917, respectively. Gates 940 and 938 are disposed over channel 935. Gates 940 and 938 are coupled to vias 929 and 925, respectively. Gates 944 and 942 are disposed over channel 937. Gates 944 and 942 are coupled to vias 921 and 929, respectively.

In one embodiment, channel 931 and gates 932 and 946 form transistors 838 and 835, respectively. Channel 933 and gates 934 and 936 a form transistors 839 and 833, respectively. Channel 935 and gates 938 and 940 form transistors 843 and 841, respectively. Channel 937 and gates 942 and 944 form transistors 847 and 845, respectively.

As can be observed from the illustration of FIG. 9, the layout of integrated circuit 901 has four degrees of symmetry, which happens to equal the number of degrees of symmetry of element 209 of FIG. 2. As will be discussed in further detail below, other layouts having different degrees of symmetry than corresponding element may be utilized in other embodiments in accordance with the teachings of the present invention.

Figure 10:
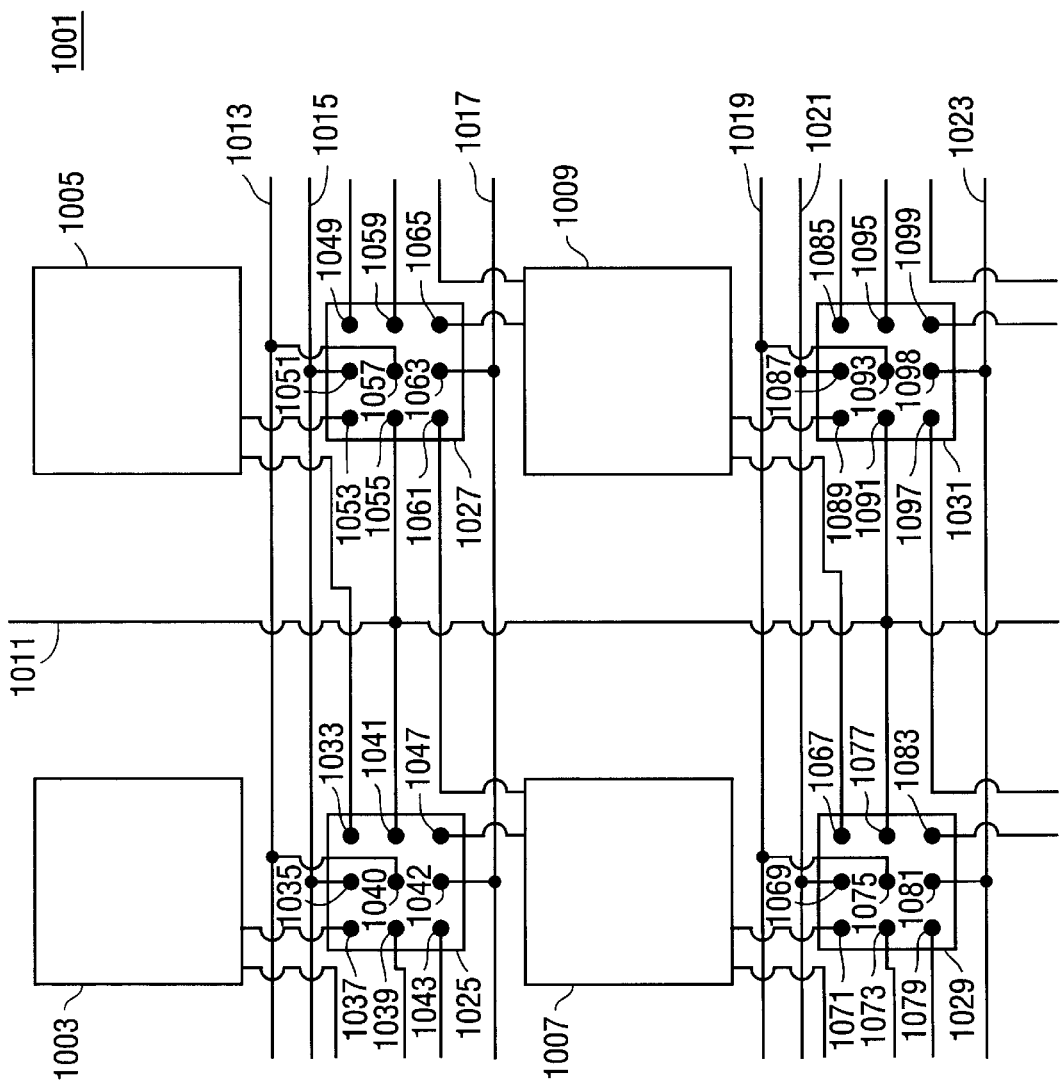
FIG. 10 is an illustration of another embodiment of a substrate of an active matrix display having a plurality of pixels and receptor sites in accordance with the teachings of the present invention.

FIG. 10 is an illustration of another embodiment of a portion of a substrate 1001 of the electronic device. In the embodiment illustrated in FIG. 10, the electronic device of substrate 1001 is an active matrix display. As shown in FIG. 10, substrate 1001 includes pixels 1003, 1005, 1007 and 1009 as well as receptor sites 1025, 1027, 1029 and 1031. In the embodiment illustrated in FIG. 10, receptor sites 1025, 1027, 1029 and 1031 are compatible with the integrated circuit dice discussed above with respect to FIGS. 8 and 9. For example, integrated circuit die 801 may be mounted on to receptor site 1025 in any one of four orientations as discussed above because integrated circuit 801 has four-fold symmetry.

In the embodiment illustrated, pixel 1003 is coupled to interface pad 1037 of receptor site 1025. Pixel 1005 is coupled to interface pad 1053 of receptor site 1027 and interface pad 1033 of receptor site 1025. Pixel 1007 is coupled to interface pad 1071 of receptor site 1029. Pixel 1009 is coupled to interface pad 1089 of receptor site 1031 and interface pad 1067 of receptor site 1029.

Assuming that integrated circuit dice such as for example those discussed above with respect to FIGS. 8 and 9 are mounted into receptor sites 1025, 1027, 1029 and 1031, operation of the active matrix display of substrate 1001 is as follows. In one embodiment, digital column select line 1011 is coupled to be received at interface pad 1041 of receptor site 1025, interface pad 1055 of receptor site 1027, interface pad 1077 of receptor site 1029 and interface pad 1091 of receptor site 1031. In the embodiment illustrated in FIG. 10, digital column select line 1011 is used to select the column including pixels 1005 and 1009.

The active matrix display of substrate 1001 also includes a digital row select lines 1015, 1017, 1021 and 1023. Digital row select line 1015 is coupled to be received by interface pad 1035 of receptor site 1025 and interface pad 1051 of receptor site 1027. Digital row select line 1017 is coupled to received by interface pad 1045 of receptor site 1025 and interface pad 1063 of receptor site 1027. Digital row select line 1021 is coupled to be received by interface pad 1069 of receptor site 1029 and interface pad 1087 of receptor site 1031. Digital row select line 1023 is coupled to be received by interface pad 1081 of receptor site 1029 and interface pad 1098 of receptor site 1031. In the embodiment illustrated, digital row select line 1015 is used to select the row of the display including pixels 1003 and 1005. Digital row select lines 1017 and 1021 are used to select the row of the display including pixels 1007 and 1009.

In one embodiment, analog lines 1013 and 1019 carry analog pixel information for the pixels of the display. As shown in FIG. 10, analog line 1013 is coupled to be received by interface pad 1040 of receptor site 1025 and interface pad 1057 of receptor site 1027. Analog line 1019 is coupled to be received by interface pad 1075 of receptor site 1029 and interface pad 1093 of receptor site 1031.

Assume during operation of the display of substrate 1001 that digital column select line 1011 is set to a logical high value and that another digital column select line that is coupled to be received by interface pad 1039 of the receptor site 1025 and interface pad 1073 of receptor site 1029 is set to logical low value. Furthermore, assume that yet another digital column select line coupled to be received by interface pad 1059 of receptor site 1027 and interface pad 1095 of receptor site 1031 is also set to logical low value. As a result, the column including pixels 1005 and 1009 is selected and other columns including the column including pixels 1003 and 1007 are deselected. In addition, assume that digital row select line 1015 is set to logical high value and that digital row select lines 1017, 1021 and 1023 are set to logical low values. Accordingly, pixel 1005 is selected and pixels 1003, 1007 and 1009 are deselected.

As a result, the analog information carried in analog line 1013 is coupled to be received by pixel 1005 and is not coupled to be received by pixel 1003. Furthermore, the analog information carried in analog line 1019 is not coupled to be received by pixels 1007 and 1009. The analog information carried in analog line 1013 is coupled to be received by pixel 1005 from interface pad 1057 through interface pad 1053. In addition, the analog information carried in analog line 1013 is also coupled to be received by pixel 1005 from interface pad 1040 through interface pad 1033.

It is noted that each pixel in the display illustrated in FIG. 10 is redundantly coupled to receive analog information from a plurality of receptor sites in accordance with the teachings of the present invention. It is appreciated that this redundancy provides additional reliability to the display of substrate 1001 in the event that there is a failure in an integrated circuit device that is included in one of the elements mounted in receptor sites 1025, 1027, 1029 and 1031.

In contrast with the display of substrate 501, each pixel of the display of substrate 1001 may be individually addressed. Therefore, in one embodiment, less analog driver circuitry is required since an entire row or an entire column is not required to be driven simultaneously. For instance, in one embodiment, well known multiplexing techniques may be utilized to drive each pixel individually or a smaller subset of pixels of the display of substrate 1001.

One characteristic of the display of substrate 1001 is that several layers of metalization are utilized to interconnect the elements of the display. Accordingly, a plurality of masking steps are required during fabrication of the display of the substrate 1001. As consequence, there are crossovers between overlapping interconnect lines in neighboring layers of metalization. For example, as shown in FIG. 10 digital column select line 1011 crosses over a plurality of other interconnect lines including analog line 1013, digital row select line 1015, etc. As can be appreciated, the crossover of interconnect lines is a potential source for interlayer short circuit defects between interconnect lines.

Figure 11:
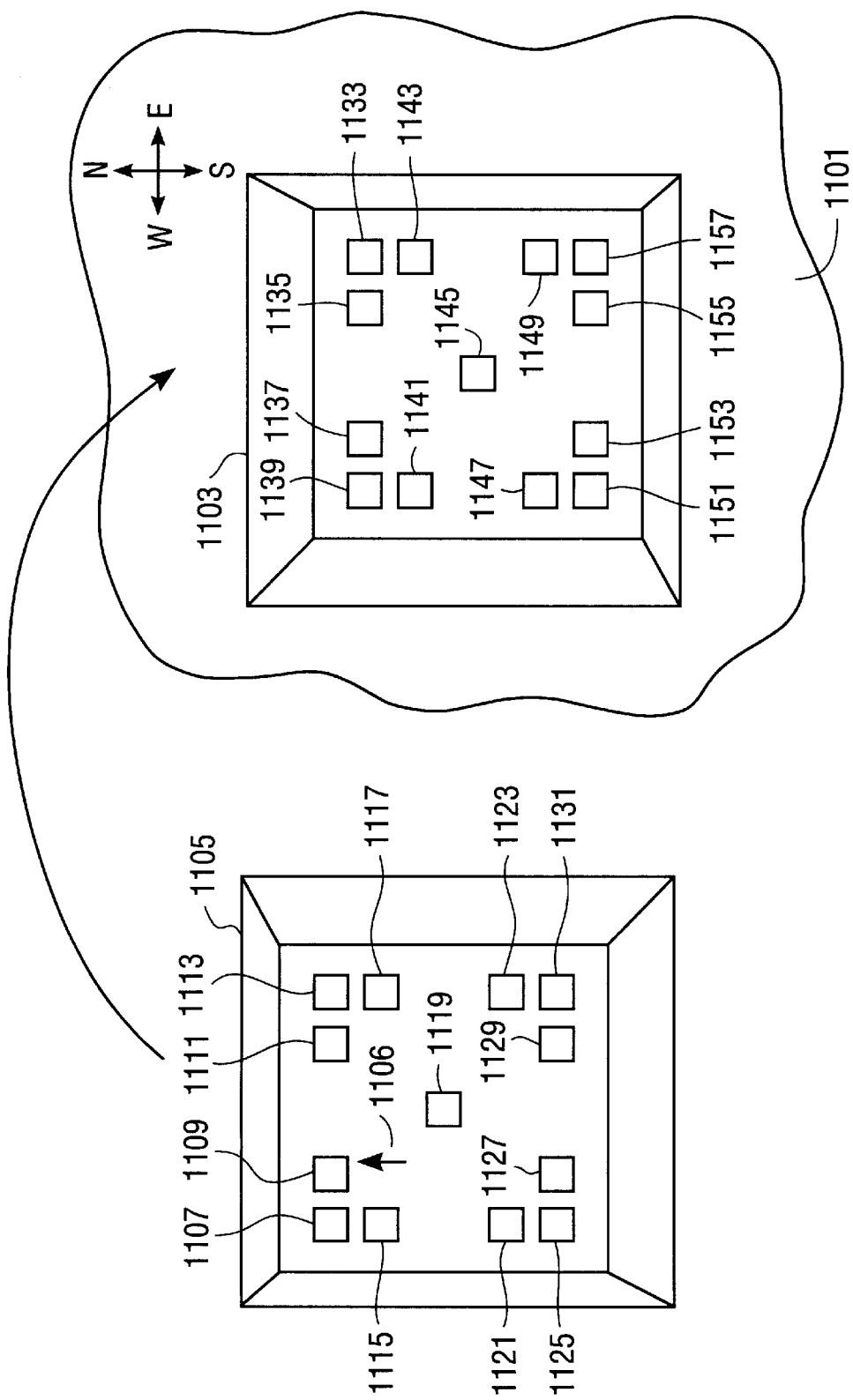
FIG. 11 is an illustration of another embodiment of a functionally symmetric integrated circuit die element having a plurality of interface pads and a corresponding mutually functionally symmetric receptor site having a plurality of corresponding interface pads.

FIG. 11 is an illustration of yet another embodiment of an element 1105 and a corresponding receptor site 1103 in a substrate 1101 in accordance with the teachings of the present invention. As shown in FIG. 11, the cross-section of element 1105 in one embodiment is trapezoidal. The trapezoidal cross-section of the elements of one embodiment of the present invention help element 1105 to be mounted into receptor site 1103 using fluidic self-assembly, vibrational tables, or the like.

Similar to element 209 and receptor site 203 of FIG. 2, element 1105 and receptor site 1103 are mutually symmetric such that element 1105 may be mounted into receptor site 1103 in any one of a plurality of orientations relative to receptor site 1103. In one embodiment, element 1105 is an integrated circuit die on a substrate. In one embodiment, the integrated circuitry of element 1105 is coupled to a plurality of interface pads 1107, 1109, 1111, 1113, 1115, 1117, 1119, 1121, 1123, 1125, 1127, 1129 and 1131, which are arranged on the substrate of element 1105. Similarly, there are a plurality of interface pads 1133, 1135, 1137, 1139, 1141, 1143, 1145, 1137, 1149, 1151, 1153, 1155 and 1157 arranged in receptor site 1103.

The above referenced interface pads are arranged in a pattern such that the interface pads of element 1105 and the interface pads of receptor site 1103 are coupled when element 1105 is mounted in receptor site 1103 in any one of a plurality of rotations. When mounted in any one of the plurality of orientations, the integrated circuit of element 1105 will provide proper function for an electronic device of substrate 1101. For explanation purposes only, assume that the top of FIG. 11 is "North" and that arrow 1106 is fixed on element 1105 as shown in FIG. 11. In the embodiment illustrated in FIG. 11, element 1105 and receptor site 1103 each have four-fold or four degrees symmetry. In the embodiment illustrated in FIG. 11, element 1105 may be mounted into receptor site 1103 with arrow 1106 pointing either "North," "East," "South" or "West."

Figure 12:
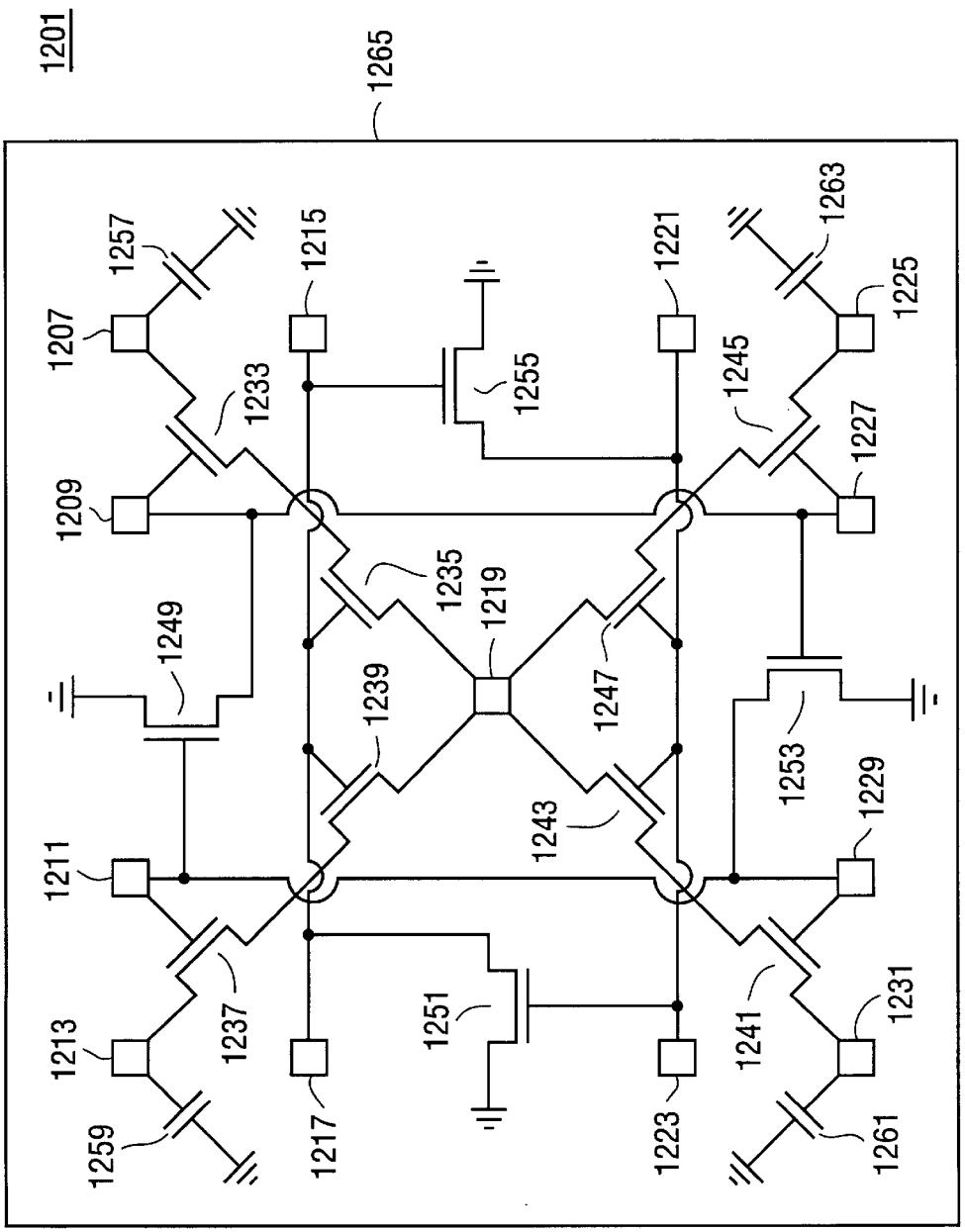
FIG. 12 is a schematic of another embodiment of integrated circuit in accordance with the teachings of the present invention.

FIG. 12 is a schematic of one embodiment integrated circuit 1201 that may be included in element 1105 in accordance with the teachings of the present invention. As shown in FIG. 12, integrated circuit 1201 include transistors 1235 and 1233 coupled between interface pads 1219 and 1207. Transistors 1239 and 1237 are coupled between interface pads 1213 and 1219. Transistors 1243 and 1241 are coupled between interface pads 1231 and 1219. Transistors 1245 and 1237 are coupled between interface pads 1219 and 1225.

As shown in FIG. 12, the gates of transistors 1233 and 1245 are coupled to interface pads 1209 and 1227. The gates of transistors 1237 and 1241 are coupled to interface pads 1211 and 1229. The gates of transistors 1239 and 1235 are coupled to interface pads 1217 and 1215. The gates of transistors 1243 and 1237 are coupled to interface pads 1223 and 1221.

It is worthwhile to note that integrated circuit 1201 provides direct crossover paths between several pairs of the interface pads. These crossover paths act as pass-through conduits. In particular, in the embodiment illustrated in FIG. 12, interface pad 1217 is directly coupled to interface pad 1215, interface pad 1223 is directly coupled to interface pad 1221, interface pad 1211 it directly coupled to interface pad 1229 and interface pad 1209 is directly coupled to interface pad 1227. As will be discussed, this direct coupling of pairs of interface pads provides crossover paths within integrated circuit 1201, which in one embodiment eliminates the need for multiple metalization layers of a completed electronic device utilizing integrated circuit 1201.

During operation, interface pad 1219 is coupled to interface pad 1207 when a logical high signal is received at interface pads 1209/1227 and interface pads 1215/1217. Interface pad 1213 is coupled to interface pad 1219 when a logical high signal is received at interface pads 1211/1229 and 1215/1217. Interface pad 1231 is coupled to interface pad 1219 when the logical high signal is received at interface pads 1211/1229 and interface pads 1221/1223. Interface pad 1225 is coupled to interface pad 1219 when a logical high signal is received at interface pads 1209/1227 and interface pads 1221/1223.

In one embodiment, integrated circuit 1201 includes sample and hold circuitry coupled to interface pads 1207, 1213, 1225 and 1291. In the embodiment illustrated in FIG. 12, the sample and hold circuitry includes a capacitor 1257 grounding interface pad 1207 to the substrate 1265 integrated circuit 1201. A capacitor 1259 grounds interface pad 1213 to substrate 1265, a capacitor 1263 grounds interface pad 1225 to substrate 1265 and a capacitor 1261 grounds interface pad 1231 to substrate 1265. In the embodiment illustrated in FIG. 12, is noted connections to ground may also be considered as connections to substrate 1265 of integrated circuit die 1201.

In one embodiment, depending on which one of a plurality of orientations in which integrated circuit die 1201 is mounted into a corresponding receptor site, interface pads 1211/1229 and 1209/1227 are coupled to receive either digital row select or digital column select signals of an active matrix display. In that embodiment, interface pads 1215/1217 and interface pads 1221/1253 are coupled to receive either digital column select or digital row select signals of the active matrix display.

In one embodiment, if interface pads 1211/1229 receive a logical high signal, it is assumed that interface pads 1209/1227 receive a logical low signal. Conversely, it interface pads 1209/1227 receive a logical high signal, it is assumed that interface pads 1211/1229 receive a logical low signal. Similarly, if interface pads 1215/1217 receive a logical high signal, it is assumed that interface pads 1221/1223 receive a logical low signal. Conversely, if interface pads 1221/1223 receive a logical high signal, it is assumed that interface pads 1215/1217 receive a logical low signal.

As discussed above with respect to FIG. 11, integrated circuit die 1201 in one embodiment is included in element 1105, which is mounted in receptor site 113 of substrate 1101. In order to reduce the amount that substrate 1265 of integrated circuit die 1201 "floats" above zero volts, a transistor 1249 is coupled between interface pads 1209/1227 and the substrate 1265, which is illustrated as ground in FIG. 12. Similarly, transistor 1251 is coupled between interface pads 1215/1217 and substrate 1265, transistor 1253 is coupled between interface pads 1211/1229 and substrate 1265 and transistor 1255 is coupled between interface pads 1221/1223 and substrate 1265.

During operation, transistor 1249 couples substrate 1265 to interface pads 1209/1227 in response to the logical high value received at interface pads 1211/1229. As discussed above, when interface pads 1211/1229 are at the logical high value, it is assumed that interface pads 1209/1227 are at the logical low value, or zero volts. As result, substrate 1265 will be maintained at ground or the logical low value during this time. Conversely, transistor 1253 couples substrate 1265 to interface pads 1211/1229 in response to a logical high signal received at interface pads 1209/1227. When interface pads 1209/1227 are at the logical high value, it is assumed that interface pads 1211/1229 are at the logical low value. Thus, substrate 1265 will be maintained at the ground or the logical low value during this time.

Similarly, transistor 1251 couples substrate 1265 to interface pads 1215/1217 in response to a logical high value received at interface pads 1221/1223. As discussed above, when interface pads 1221/1223 are at the logical high value, it is assumed that interface pads 1215/1217 are at the logical low value, thereby maintaining substrate 1265 at ground or the logical low value during this time. Conversely, transistor 1255 couples substrate 1265 to interface pads 1221/1223 in response to a logical high signal received at interface pads 1215/1217. When interface pads 1215/1217 are at the logical high value, it is assumed that interface pads 1221/1223 are at the logical low value. Thus, substrate 1265 will be maintained at the ground or the logical low value during this time. As can be appreciated, by maintaining substrate 1265 at ground, the risks of latch up or other undesirable consequences are reduced.

Figure 13:
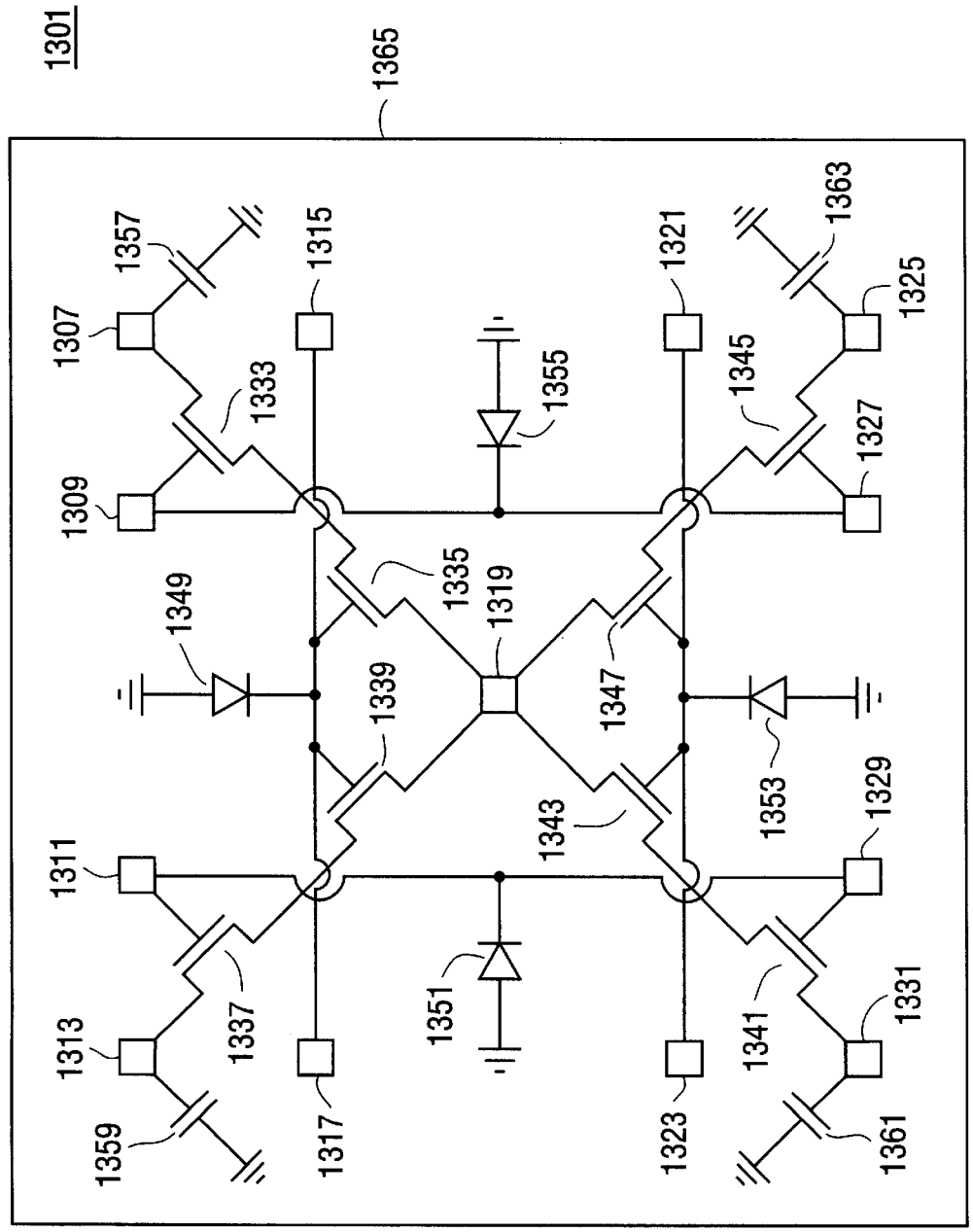
FIG. 13 is a schematic of yet another embodiment of an integrated circuit in accordance with the teachings of the present invention.

FIG. 13 is a schematic of another embodiment of an integrated circuit die 1301 in accordance with the teachings of the present invention. Integrated circuit die 1301 is similar to integrated circuit die 1201 and interface pads 1307, 1309, 1311, 1313, 1315, 1317, 1319, 1321, 1323, 1325, 1327, 1329 and 1331 correspond to interface pads 1207, 1209, 1211, 1213, 1215, 1217, 1219, 1221, 1223, 1225, 1257, 1229 and 1231, respectively. Transistors 1333, 1335, 1337, 1339, 1341, 1343, 1345 and 1347 correspond to transistors 1233, 1235, 1237, 1239, 1241, 1243, 1245 and 1237, respectively. Sample and hold circuitry capacitors 1357, 1359, 1361 and 1363 correspond to capacitors 1257, 1259, 1261 and 1263, respectively.

In order to maintain the substrate 1365 of integrated circuit die 1301 at ground, integrated circuit die 1301 includes a diode 1349 coupled between interface pads 1315/1317 and substrate 1365, a diode 1351 coupled between interface pads 1311/1329 and substrate 1365, a diode 1353 coupled between interface pads 13211/1323 and substrate 1365 and a diode 1355 coupled between interface pads 1309/1327 and substrate 1365. It is noted that substrate 1365 is also represented as ground in the schematic of integrated circuit die 1301.

Similar to the operation of integrated circuit dial 1201, it is assumed that when interface pads 1311/1329 are at a high logical value, interface pads 1309/1327 are at a low logical value and vice versa. Similarly, it is assumed that when interface pads 1315/1317 are at a high logical value, interface pads 1321 and 1323 are at the low logical value or vice versa.

In order to reduce the amount that the substrate 1365 of integrated circuit die 1301 "floats" above zero volts, at least one of the diodes 1349, 1351, 1353 or 1355 will pull substrate 1365 down to zero volts. For example, assume that substrate 1365 rises to a voltage greater than zero volts and that interface pads 1317/1315 are at zero volts. In this situation, diode 1349 will "turn on" to maintain substrate 1365 at ground. Operation of diodes 1351, 1353 and 1355 is similar. By maintaining substrate 1365 at zero volts, it is appreciated that the risks of latch up other undesirable consequences are reduced.

Figure 14:
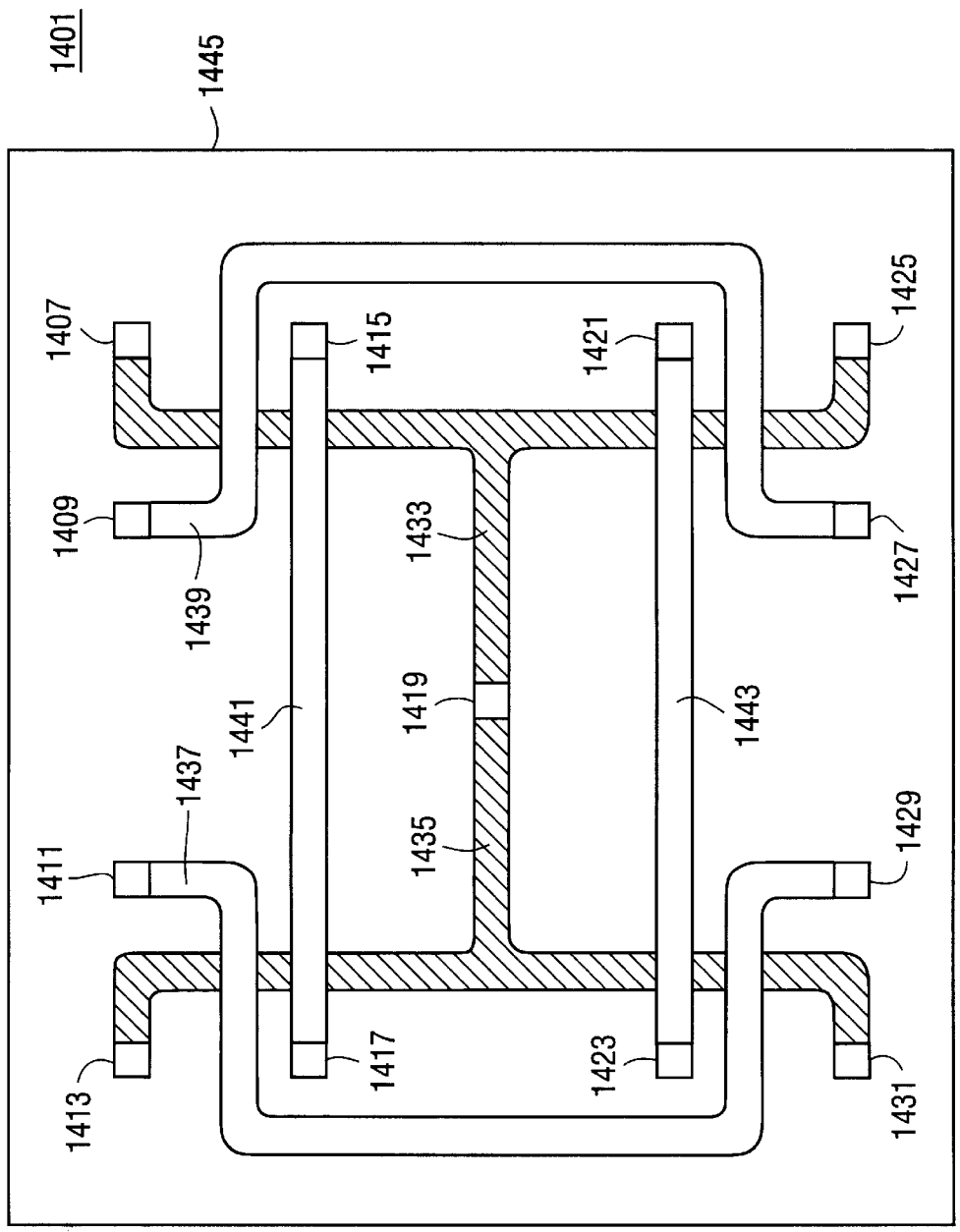
FIG. 14 is an illustration of yet another embodiment of a layout of an integrated circuit die in accordance with the teachings of the present invention.

FIG. 14 is an illustration showing one embodiment of a layout of an integrated circuit die 1401 in a substrate 1445 in accordance with the teachings of the present invention. The layout of integrated circuit die 1401 of FIG. 14 corresponds to either one of the embodiments illustrated in FIGS. 12 or 13. In one embodiment, substrate 1445 is a semiconductor substrate including silicon. In one embodiment, substrate 1445 is a semiconductor substrate including single crystal silicon.

In one embodiment, integrated circuit die includes vias 1407, 1409, 1411, 1413, 1415, 1417, 1419, 1421, 1423, 1425, 1427, 1459 and 1431. The vias of the integrated circuit die 1401 are coupled to interface pads 1207, 1209, 1211, 1213, 1215, 1217, 1219, 1221, 1223, 1225, 1227, 1229 or 1231, respectively. The vias of integrated circuit die 1401 may also be coupled to interface pads 1307, 1309, 1311, 1313, 1315, 1317, 1319, 1321, 1323, 1325, 1327, 1329 or 1331, respectively.

As shown in FIG. 14, a channel 1433 is disposed in substrate 1445 and is coupled between interface pads 1419 and 1407. Channel 1433 is also coupled between interface pads 1419 and 1425. A channel 1435 is disposed and substrate 1445 and is coupled between interface pads 1413 and 1419. Channel 1435 is also coupled between interface pad 1431 and 1419.

As also shown in FIG. 14, a gate 1441 is coupled between interface pads 1415 and 1417 and is disposed over a portion of channel 1435 between interface pads 1413 and 1419. Gate 1441 is also disposed over a portion of channel 1433 disposed between interface pads 1407 and 1419. A gate 1443 is coupled between interface pads 1421 and 1423. Gate 1443 is disposed over a portion of channel 1435 between interface pads 1419 and 1431. Gate 1443 is also disposed over a portion of channel 1433 between interface pads 1419 and 1425. A gate 1437 is coupled between interface pads 1411 and 1429 and is disposed over a portion of channel 1435 between interface pads 1413 and 1419. Gate 1437 is also disposed over a portion of channel 1435 between interface pads 1419 and 1431. A gate 1439 is disposed between interface pads 1409 and 1427 and is disposed over a portion of channel 1433 between interface pads 1419 and 1407. Gate 1439 is also disposed over a portion of channel 1433 between interface pads 1419 and 1425.

It is noted that gate 1437 provides a direct crossover path or pass-through conduit between interface pads 1411 and 1429. Gate 1439 provides a direct crossover path between interface pads 1409 and 1427. Gate 1441 provides a direct crossover path between interface pads 1415 and 1417. Gate 1443 provides a direct crossover path between interface pads 1421 and 1423.

As can be observed from the illustration in FIG. 14, the layout of integrated circuit die 1401 has two degrees of symmetry, even though element 1105 has four degrees of symmetry. Therefore, it is appreciated that the layout of an integrated circuit die in accordance with teachings of the present invention may have a different number of degrees of symmetry than the corresponding element.

Figure 15:
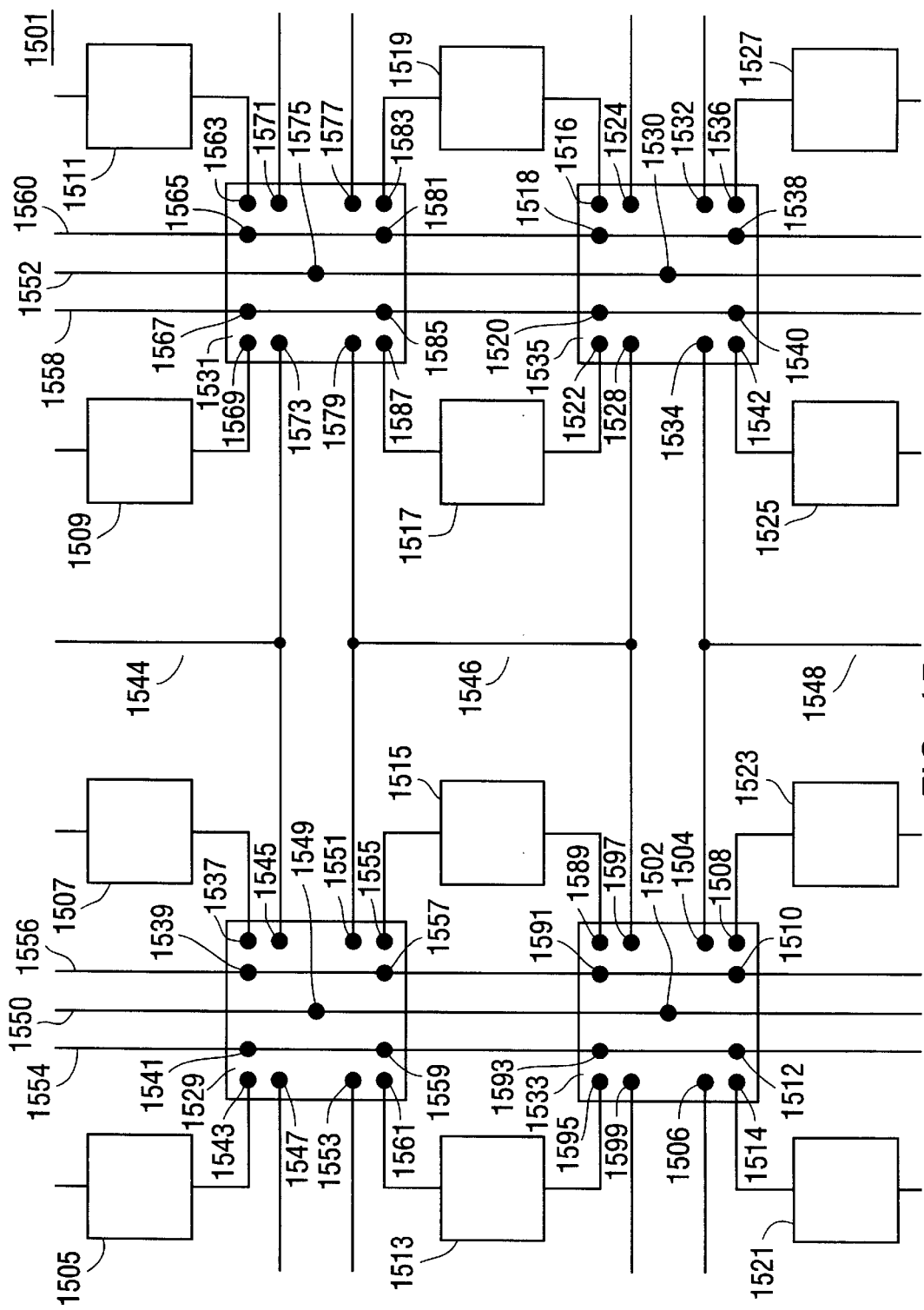
FIG. 15 is an illustration of yet another embodiment of a substrate of an active matrix display having a plurality of pixels and receptor sites in accordance with the teachings of the present invention.

FIG. 15 is an illustration of one embodiment of a substrate 1501 of the electronic device. In the embodiment illustrated FIG. 15, the electronic device of substrate 1501 is an active matrix display. As shown in FIG. 15, substrate 1501 includes pixels 1505, 1507, 1509, 1511, 1513, 1515, 1517, 1519, 1521, 1523, 1525 and 1527. Substrate 1501 also includes receptor sites 1529, 1531, 1533 and 1535. In the embodiment illustrated in FIG. 15, receptor sites 1529, 1531, 1533 and 1535 are compatible with the integrated circuit dice discussed above with respect to FIGS. 11–14. For example, a plurality of integrated circuit dice having the schematics of integrated circuit die 1201 may be mounted into receptor sites 1529, 1531, 1533 and 1535 in any one of the above discussed plurality of orientations to enable the active matrix display of substrate 1501 to function properly.

As shown in FIG. 15, pixels 1505 and 1507 are coupled to interface pads 1543 and 1537, respectively, of receptor site 1529. Pixels 1509 and 1511 are coupled to interface pads 1559 and 1563, respectively, of receptor site 1531. Pixel 1513 is coupled to interface pad 1561 of receptor site 1529 and interface pad 1595 of receptor site 1533. Pixel 1515 is coupled to interface pad 1555 of receptor site 1529 and interface pad 1589 of receptor site 1533. Pixel 1517 is coupled to interface pad 1587 of receptor site 1531 and interface pad 1522 of receptor site 1535. Pixel 1519 is coupled to interface pad 1581 of receptor site 1531 and interface pad 1516 of receptor site 1535. Interface pads 1521 and 1523 are coupled to interface pads 1514 and 1508, respectively, of receptor site 1533. Pixels 1525 and 1527 are coupled to interface pads 1542 and 1536, respectively of receptor site 1535.

Assuming that integrated circuit dice such as for example those discussed above with respect to FIGS. 11–14 are mounted into receptor sites 1529, 1531, 1533 and 1535, operation of the active matrix display of the substrate 1501 is as follows. In one embodiment, a digital column select line 1554 is coupled to be received by interface pads 1541 and 1559 of receptor site 1529 and interface pads 1593 and 1512 of receptor site 1533. Digital column select line 1556 is coupled to be received by interface pads 1539 and 1557 of receptor site 1529 and interface pads 1591 and 1510 of receptor site 1533. Digital column select line 1558 is coupled to be received by interface pads 1557 and 1585 of receptor site 1531 and interface pads 1520 and 1540 of receptor site 1535. Digital column select line 1560 is coupled to be received by interface pad 1565 and 1583 of receptor site 1531 and interface pads 1518 and 1538 of receptor site 1535.

In the embodiment illustrated in FIG. 15, digital row select line 1554 couples together interface pad 1545 of receptor site 1529 and interface pad 1573 of receptor site 1531. Digital row select line 1546 couples together interface pad 1551 of receptor site 1529, interface pad 1579 of receptor site 1531, interface pad 1597 of receptor site 1533 and interface pad 1528 of receptor site 1513. Digital row select line 1548 couples together interface pad 1504 of receptor site 1533 and interface pad 1534 of receptor site 1535.

As discussed above with respect to the integrated circuit dice of FIGS. 12–14, the integrated circuit dice that are mounted into receptor sites 1529, 1531, 1533 and 1535 include direct crossover connections or pass-through conduits between certain pairs of interface pads. For instance, interface pad 1547 and 1545 will be directly coupled after an integrated circuit die is mounted into receptor site 1529, thereby illuminating the need for a corresponding crossover in the metalization layers of the active matrix display of substrate 1501. Similarly, interface pad 1551 will be directly coupled to interface pad 1553. Interface pad 1597 will be directly coupled to interface pad 1599 and interface pad 1504 will be directly coupled to interface pad 1506. Interface pad 1571 will be directly coupled to interface pad 1573 and interface pad 1577 will be directly coupled to interface pad 1579. Interface pad 1524 will be directly coupled to interface pad 1528 and interface pad 1532 will be directly coupled to interface pad 1534.

Thus, in the embodiment illustrated in FIG. 15, only one layer of metalization, and therefore only one masking step, is needed after the integrated circuit dice are mounted into receptor sites 1529, 1531, 1533 and 1535. As can be appreciated to those skilled in the art, since only one layer of metalization is needed, only one masking step is needed in one embodiment of the present invention.

With the above discussed crossover connections, interface pads 1547, 1545, 1573 and 1571 are coupled to receive one digital row select signal. Interface pads 1553, 1551, 1579, 1577, 1599, 1597, 1528 and 1524 are coupled to receive another digital row select signal. Interface pads 1506, 1504, 1534 and 1532 are coupled to receive yet another digital row select signal.

In one embodiment, digital column select line 1554 is used to select the column of the active matrix display of substrate 1501 including pixels 1505, 1513 and 1521. Digital column select line 1556 is used to select the column including pixels 1507, 1515 and 1523. Digital column select line 1558 is used to select the column including pixels 1509, 1517 and 1525. Digital column select line 1560 is used to select the column including pixels 1511, 1519 and 1527. In one embodiment, the digital row select line coupled to be received by interface pads 1547, 1545, 1573 and 1571 is used to select the row of pixels including pixels 1505, 1507, 1509 and 1511. The digital row select line coupled to be received by interface pads 1553, 1551, 1579, 1577, 1599, 1597, 1528 and 1524 is used to select the row Of pixels including pixels 1513, 1515, 1517 and 1519. The digital row select line coupled to be received by interface pads 1506, 1904, 1994 and 1532 is used to select the row of pixels including pixels 1521, 1523, 1525 and 1527. By using the above discussed digital row select lines and digital column select lines, it is appreciated that each pixel of the active matrix display of substrate 1501 can be individually addressed in accordance with the teachings of the present invention.

In the embodiment illustrated in FIG. 15, analog line 1550 carries analog pixel information and is coupled to be received by interface pad 1549 of receptor site 1529 and interface pad 1502 of receptor site 1533. Analog line 1552 also carries pixel information and is coupled to be received by interface pad 1575 of receptor site 1531 and interface pad 1513 of receptor site 1535.

Assume during operation of the active matrix display of substrate 1501 that digital column select lines 1556 and 1560 are set to a logical high value and that digital column select lines 1554 and 1558 are set to a logical low value. In this instance, the columns of pixels including pixels 1507, 1515 and 1553 as well as pixels 1511, 1519 and 1527 are selected. The columns including pixels 1505, 1513 and 1521 as well as pixels 1509, 1517 and 1525 are deselected.

Assume further that the digital row select signal coupled to be received by interface pads 1553, 1551, 1579, 1577, 1599, 1597, 1528 and 1524 is set to a logical high value. Assume also that the digital row select signals coupled to be received by interface pads 1547, 1545, 1573, 1571, 1506, 1504, 1534 and 1532 are set to a logical low value. Thus, the row of pixels in the active matrix display of substrate 1501 including pixels 1513, 1515, 1517 and 1519 is selected. The rows of pixels including pixels 1505, 1507, 1509, 1511, 1521, 1523, 1525 and 1527 are deselected.

With the digital row and column select lines set as described above, it is appreciated that pixels 1515 and 1519 are individually selected while the remaining pixels are deselected. With pixel 1515 selected, the analog information carried in analog line 1515 is coupled to be received by pixel 1515 from interface pad 1549 through interface pad 1555. In addition, the analog information carried in analog line 1515 is also coupled to be received by pixel 1515 from interface pad 1502 through interface pad 1589. Similarly, the analog information carried in analog line 1552 is coupled to be received by pixel 1519 from interface pad 1575 through interface pads 1581. Furthermore, the analog information carried in analog line 1552 is also coupled to be received by pixel 1519 from interface pad 1530 through interface pad 1516. It is appreciated that the remaining pixels shown in FIG. 15, with the digital row and column select lines set as described above, are deselected and are therefore not coupled to receive analog information from analog lines 1550 and 1552.

It is noted that each pixel 1505, 1507, 1509, 1511, 1513, 1515, 1517, 1519, 1521, 1523, 1525 and 1527 of the active matrix display illustrated in FIG. 15 is redundantly coupled to receive analog pixel information through a plurality of receptor sites in accordance with the teachings of the present invention. Is appreciated that this redundancy provides additional reliability to the active matrix display of FIG. 15 in the event that there is a failure in an integrated circuit device that is mounted in receptor sites 1529, 1531, 1533 or 1535.

Figure 16:
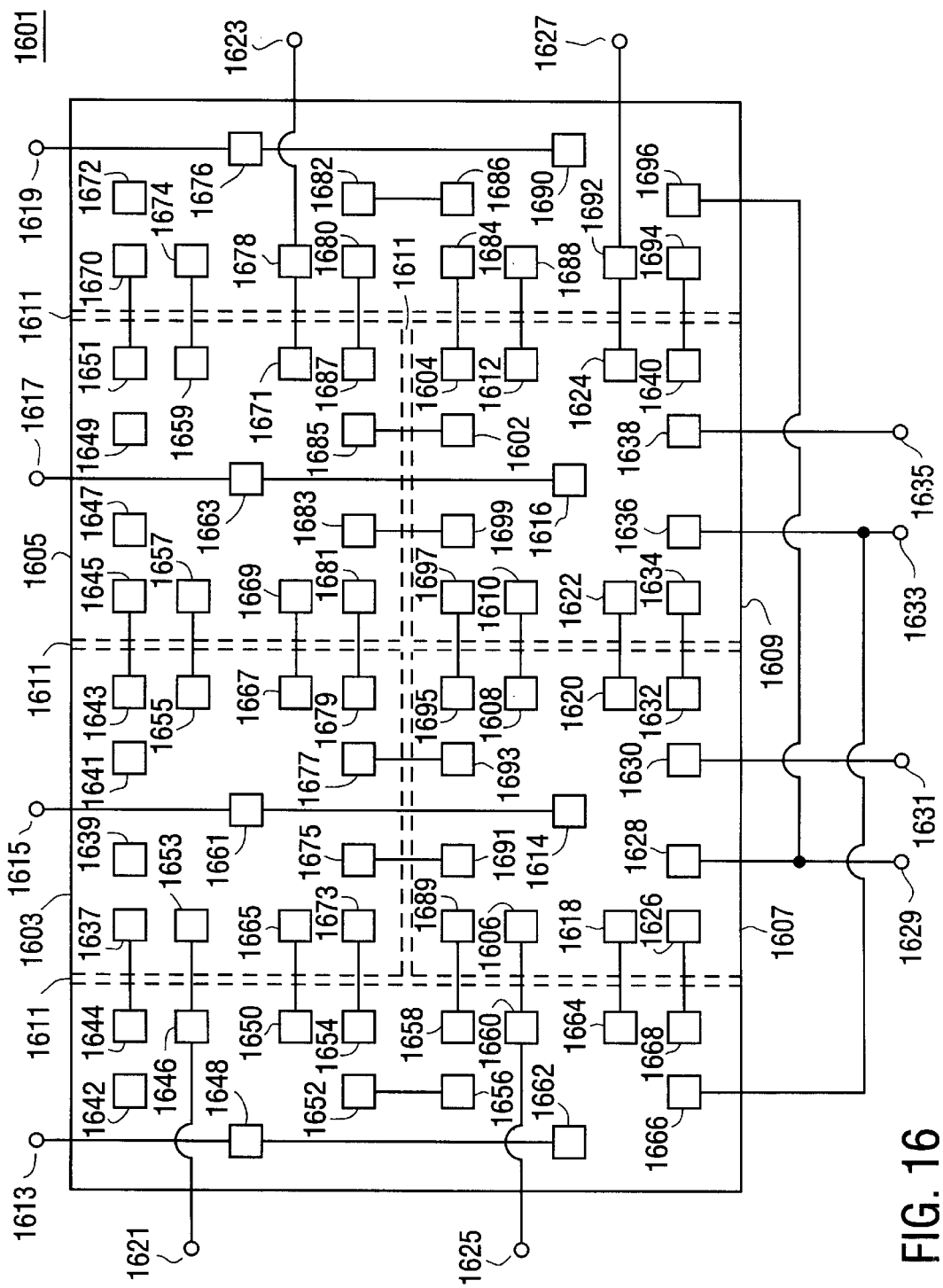
FIG. 16 is an illustration of one embodiment of a wafer including a plurality of integrated circuit dice arranged thereon with testing interconnects disposed across boundary areas in accordance with the teachings of the present invention.

FIG. 16 is an illustration of a wafer 1601 in accordance with the teachings of the present invention. In one embodiment, a plurality of integrated circuit dice 1603, 1605, 1607 and 1609 are fabricated arranged on an individual wafer 1601. After wafer 1601 is fabricated and tested, a boundary area 1611 of wafer 1601 is removed to separate integrated circuit dice 1603, 1605, 1607 and 1609 from each other. As will be discussed in greater detail below, wafer 1601 includes testing interconnects coupled between some of the interface pads of the integrated circuit dice of wafer 1601. These testing interconnects enable testing of each of the integrated circuit dice included in wafer 1601. Defective integrated circuit dice that are identified may be marked and discarded while the remaining non-defective integrated circuit dice of wafer 1601 may be utilized. The testing interconnects that are disposed across boundary area 1611 are severed when the integrated circuit dice 1603, 1605, 1607 and 1609 are separated.

In the embodiment illustrated in FIG. 16, integrated circuit dice 1603, 1605, 1607 and 1609 correspond to the integrated circuit dice discussed above with respect to FIGS. 11–14, and may be utilized in the receptor sites of FIG. 15. Thus, in one embodiment, the function of interface pads 1637, 1639, 1641, 1643, 1653, 1655, 1661, 1665, 1667, 1673, 1675, 1677 and 1679 correspond to the function of interface pads 1413, 1411, 1409, 1407, 1417, 1415, 1419, 1423, 1421, 1431, 1429, 1427 and 1425, respectively. The function of interface pads 1645, 1647, 1649, 1651, 1657, 1659, 1663, 1669, 1671, 1681, 1683, 1685 and 1687 correspond to the function of interface pads 1413, 1411, 1409, 1407, 1417, 1415, 1419, 1423, 1421, 1431, 1429, 1427 and 1425, respectively. The function of interface pads 1689, 1691, 1693, 1695, 1606, 1608, 1614, 1618, 1620, 1626, 1628, 1630 and 1632 correspond to function of interface pads 1413, 1411, 1409, 1407, 1417, 1415, 1419, 1423, 1421, 1431, 1429, 1427 and 1425, respectively. Finally, the function of interface pads 1697, 1699, 1602, 1604, 1610, 1612, 1616, 1622, 1624, 1634, 1636, 1638 and 1640 correspond to the function of interface pads 1413, 1411, 1409, 1407, 1417, 1415, 1419, 1423, 1421, 1431, 1429, 1427 and 1425, respectively.

In one embodiment, wafer 1601 also includes additional circuitry used for testing the integrated circuit dice 1603, 1605, 1607 and 1609. In the embodiment illustrated, the additional circuitry performs similar function as the corresponding interface pads of integrated circuit dice 1603, 1605, 1607 and 1609. In particular, the function of Interface pads 1642, 1644, 1646, 1648, 1650, 1652 and 1654 correspond to the function of interface pads 1409, 1407, 1445, 1419, 1421, 1427 and 1425. The function of interface pads 1656, 1658, 1660, 1662, 1664, 1666 and 1668 also correspond to the function of interface pads 1409, 1407, 1445, 1419, 1421, 1427 and 1425. The function of interface pads 1670, 1672, 1674, 1676, 1678, 1680 and 1682 correspond to the function of interface pads 1413, 1411, 1417, 1419, 1423, 1431 and 1429. Finally, the function of interface pads 1684, 1686, 1688, 1690, 1692, 1694 and 1696 also correspond to the function of interface pads 1413, 1411, 1417, 1419, 1423, 1431 and 1429.

As shown in FIG. 16, wafer 1601 includes testing interconnects coupling across boundary area 1611 interface pads 1644 and 1637, 1646 and 1653, 1650 and 1665, 1654 and 1673, 1658 and 1689, 1660 and 1606, 1664 and 1618, 1668 and 1626, 1643 and 1645, 1655 and 1657, 1667 and 1669, 1679 and 1681, 1695 and 1697, 1608 and 1610, 1620 and 1622, 1632 and 1634, 1651 and 1670, 1659 and 1674, 1671 and 1678, 1687 and 1680, 1604 and 1684, 1612 and 1688, 1624 and 1692 and 1640 and 1694. Wafer 1601 also includes testing interconnects coupled between interface pads 1648 and 1662, 1652 and 1656, 1682 and 1686 and 1676 and 1690. Furthermore, wafer 1601 includes interconnects 1613, 1615, 1617 and 1619 to access interface pads 1648, 1651, 1663 and 1676, respectively.

As shown in FIG. 16, one embodiment of wafer 1601 also includes digital row select line 1621 coupled to be received by interface pad 1646. Digital row select line 1623 is coupled to be received by interface pad 1678. Digital row select line 1625 is coupled to be received by interface pads 1660. Digital row select line 1627 is coupled to be received by interface pad 1692. In one embodiment, wafer 1601 also includes digital column select line 1629 coupled to interface pads 1628 and 1696. Digital column select line 1631 is coupled to interface pad 1630. Digital column select line 1633 coupled to interface pads 1666 and 1636. Digital column select line 1635 coupled to interface pad 1638.

Testing of the integrated circuit dice 1603, 1605, 1607 and 1609 of wafer 1601 may be conducted as follows. To test the integrated circuit devices in connection with the switchable coupling between interface pads 1661 and 1637, digital row select line 1621 and digital column select lines 1629 and 1633 are set to logical high value while digital row select lines 1623, 1625 and 1627 and digital column select line 1631 are set to a logical low value. It is appreciated that by setting the digital column in row select lines as described above, the switchable coupling between interface pads 1648 and 1661 is also switched on. By setting the digital column and row select lines to settings other than those described above, the switchable couplings between interface pads 1648 and 1661 and interface pads 1661 and 1637 is switched off.

With the digital column and row select lines settings described above, the switchable couplings may be tested through testing interconnects 1613 and 1615. In particular, with digital row select line 1621 at a logical high value, interface pads 1646 and 1653 receive a logical high value. Similarly, with digital column select lines 1629 and 1633 and logical high values, interface pads 1642 and 1639 receive logical high values. It is reminded that interface pad 1642 receives the logical high value from digital column select line 1633 through the direct crossover connection between interface pads 1642 and 1652, the testing interconnect between interface pads 1652 and 1656 and the direct crossover connection between interface pads 1656 and 1666. Similarly, it is appreciated that interface pad 1639 receives the logical high value from digital column select line 1629 through the direct crossover connection between interface pads 1639 and 1675, the testing interconnect between interface pads 1675 and 1691 and the direct crossover connection between interface pads 1691 and 1628. Therefore, the coupling between testing interconnects 1613 and 1615 through interface pad 1648 from interface pad 1644, through the testing interconnect between interface pads 1644 and 1637 and from interface pad 1637 through interface pad 1661.

In one embodiment, it is appreciated that the integrated circuit devices in connection with the switchable coupling between interface pads 1663 and 1651 may be tested concurrently with the testing of the integrated circuit devices in connection with the switchable coupling between interface pads 1661 and 1637. In particular, with digital row select line 1621 set to logical high value, digital row select lines 1623, 1625 and 1627 set to logical low value, digital column select lines 1629 and 1635 set to logical high value and digital column select lines 1631 and 1633 set to logical low value, a switchable coupling can be verified between interface pads 1648 and 1661 and 1663 and 1676 concurrently in accordance with the teachings of the present invention. In particular, with digital row select line 1621 at a logical high value, interface pads 1659 and 1674 as well as interface pads 1646 and 1653 receive the logical high value. With digital column select lines 1629 and 1635 set to logical high value, interface pads 1639 and 1675, 1672 and 1682 as well as 1649 and 1685 receive logical high values. The switchable coupling that can be verified between testing interconnects 1617 and 1619 is a from interface pad 1663 through interface pad 1651, through the testing interconnect between interface pads 1651 and 1670, and from interface pads 1670 through interface pad 1676.

In one embodiment, after the above described switchable couplings have been verified, testing may continue to the next switchable couplings in the integrated circuit dice of wafer 1601 by setting the digital column and row select lines of wafer 1601 accordingly. For example, after the switchable coupling between interface pads 1637 and 1661 has been tested, the switchable coupling between interface pads 1661 and 1673 may be tested by setting digital row select line 1621 to logical low value and setting digital row select line 1623 to a high logical value. The digital column select lines settings remain unchanged. Next, the switchable coupling between interface pads 1689 and 1614 may be tested by setting digital row select line to a logical low value and setting digital row select line 1625 to logical high value. The digital column select line values remain unchanged. To test the switchable coupling between interface pads 1614 and 1626, digital row select line 1625 is set to the logical low value and digital row select line 1627 is set to high logical value. Once again, the digital column select line values remain in change. Next, testing can proceed to the another column in accordance with the teachings of the present invention.

After all the switchable couplings of the integrated circuit dice of wafer 1601 have been successfully verified, the integrated circuit dice may be separated and utilized in accordance with the teachings of the present invention. In the event that a defect is identified using the above described testing procedure, the defective integrated circuit die may be marked and set aside while the remaining properly functioning integrated circuit dice may be utilized.

In the environment illustrated in FIG. 16, integrated circuit dice 1603, 1605, 1607 and 1609 are separated by removing the boundary area 1611 of wafer 1601. By removing boundary area 1611, is noted that the testing interconnects crossing boundary area 1611 are severed. In one embodiment, it is noted that the severing of these testing interconnects between the interface pads of neighboring integrated circuit dice is acceptable after testing of the corresponding wafer has been completed as the testing interconnects are no longer are utilized.

It is appreciated that the embodiment illustrate in FIG. 16 is merely in one embodiment of a wafer including a plurality of integrated circuit dice arranged therein. It is appreciated that other embodiments of wafer is, such as for example a wafer including a larger or smaller number of integrated circuit dice arranged thereon, may also be tested in accordance with teachings of the present invention.

Figure 17:
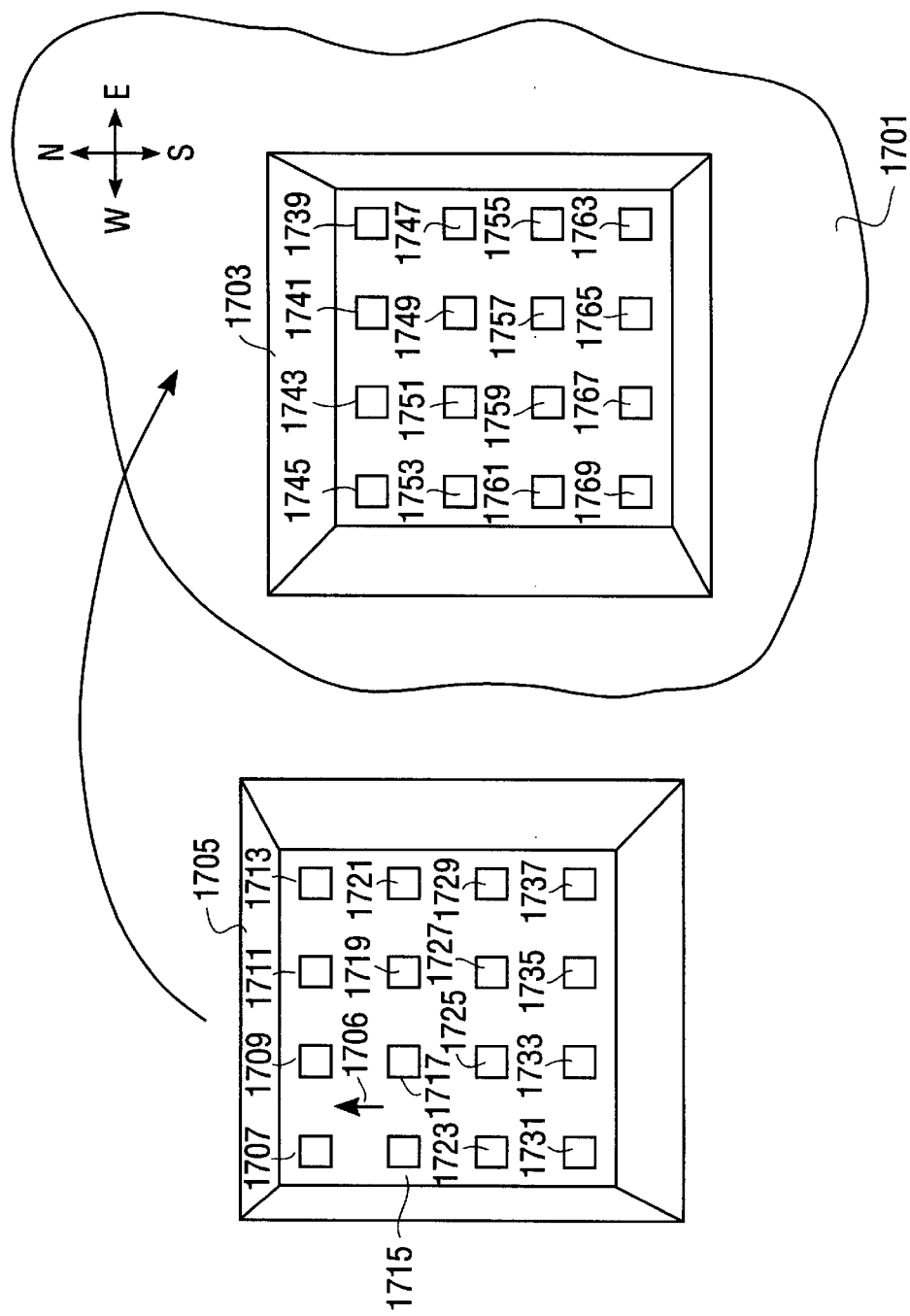
FIG. 17 is an illustration of still another embodiment of a functionally symmetric integrated circuit die element having a plurality of interface pads and a corresponding mutually functionally symmetric receptor site having a plurality of corresponding interface pads.

FIG. 17 is an illustration of yet another embodiment of an element 1705 and a corresponding receptor site 1703 in a substrate 1701 in accordance with the teachings of the present invention. As shown in FIG. 17, the cross-section of element 1705 in one embodiment is trapezoidal. The trapezoidal cross-section of the elements of one embodiment of the present invention help element 1705 to be mounted into receptor site 1703 using fluidic self-assembly, vibrational tables, or the like.

Similar to element 209 and receptor site 203 of FIG. 2, element 1705 and receptor site 1703 are mutually symmetric such that element 1705 may be mounted into receptor site 1703 in any one of a plurality of orientations relative to receptor site 1703. In one embodiment, element 1705 is an integrated circuit die on a substrate. In one embodiment, the integrated circuitry of element 1705 is coupled to a plurality of interface pads 1707, 1709, 1717, 1713, 1715, 1717, 1719, 1721, 1723, 1725, 1727, 1729, 1731, 1733, 1735 and 1737 which are arranged on the substrate of element 1705. Similarly, there are a plurality of interface pads 1739, 1741, 1743, 1745, 1747, 1749, 1751, 1753, 1755, 1757, 1759, 1761, 1763, 1765, 1767 and 1769 arranged in receptor site 1703.

The above referenced interface pads are arranged in a pattern such that the interface pads of element 1705 and the interface pads of receptor site 1703 are coupled when element 1705 is mounted in receptor site 1703 in any one of a plurality of rotations. When mounted in any one of the plurality of orientations, the integrated circuit of element 1705 will provide proper function for an electronic device of substrate 1701. For explanation purposes only, assume that the top of FIG. 17 is "North" and that arrow 1706 is fixed on element 1705 as shown in FIG. 17. In the embodiment illustrated in FIG. 17, element 1705 and receptor site 1703 each have four-fold or four degrees symmetry. In the embodiment illustrated in FIG. 17, element 1705 may be mounted into receptor site 1703 with arrow 1706 pointing either "North," "East," "South" or "West."

Figure 18:
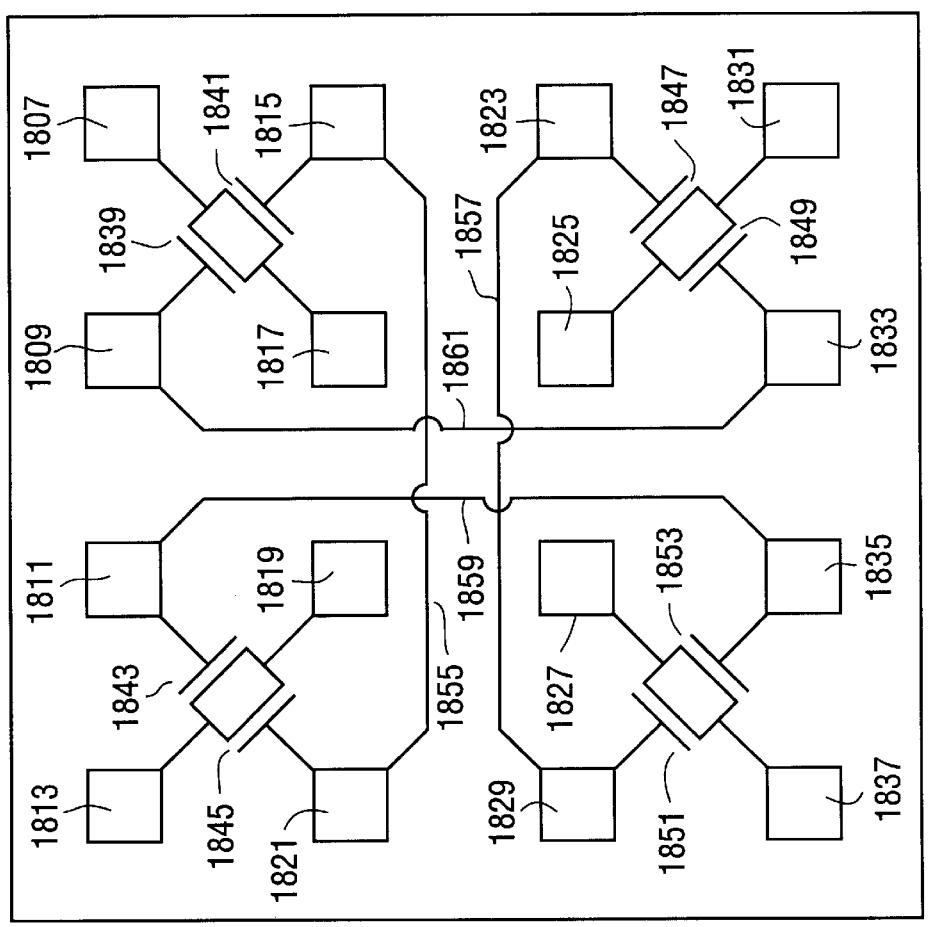
FIG. 18 is a schematic of still another embodiment of integrated circuit in accordance with the teachings of the present invention.

FIG. 18 is a schematic of one embodiment integrated circuit 1801 that may be included in element 1705 in accordance with the teachings of the present invention. As shown in FIG. 18, integrated circuit 1801 includes transistors 1839 and 1841 coupled between interface pads 1807 and 1817. Transistors 1843 and 1845 are coupled between interface pads 1813 and 1819. Transistors 1847 and 1849 are coupled between interface pads 1825 and 1831. Transistors 1851 and 1853 are coupled between interface pads 1827 and 1837.

As shown in FIG. 18, the gate of transistor 1839 is coupled to interface pad 1809 and the gate of transistor 1841 is coupled to interface pad 1815. The gate of transistor 1843 is coupled to interface pad 1811 and the gate of transistor 1845 is coupled to interface pad 1821. The gate of transistor 1847 is coupled to interface pad 1823 and the gate of transistor 1849 is coupled to interface pad 1853. The gate of transistor 1851 is coupled to interface pad 1829 and the gate of transistor 1853 is coupled to interface pad 1835.

It is worthwhile to note that integrated circuit 1801 provides direct crossover paths or pass-through conduits between several pairs of the interface pads. In particular, in the embodiment illustrated in FIG. 18, interface pad 1809 is directly coupled to interface pad 1833 through crossover path 1861. Interface pad 1811 is directly coupled to interface pad 1835 through crossover path 1859. Interface pad 1821 is directly coupled to interface pad 1815 through crossover path 1855. Interface pad 1829 is directly coupled to interface pad 1823 through crossover path 1857. In one embodiment, crossover paths 1855, 1857, 1859 and 1861 eliminate the need for multiple metalization layers of a completed electronic device utilizing integrated circuit 1801.

During operation, interface pad 1817 is coupled to interface pad 1807 when a logical high signal is received on interface pads 1809/1833 or 1815/1821. Interface pad 1819 is coupled to interface pad 1813 when a logical high signal is received on interface pads 1811/1835 or 1821/1815. Interface pad 1827 is coupled to interface pad 1837 when a logical high signal is received on interface pads 1829/1823 or 1835/1811. Interface pad 1825 is coupled to interface pad 1831 when a logical high signal is received on interface pads 1823/1829 or 1833/1809.

Figure 19:
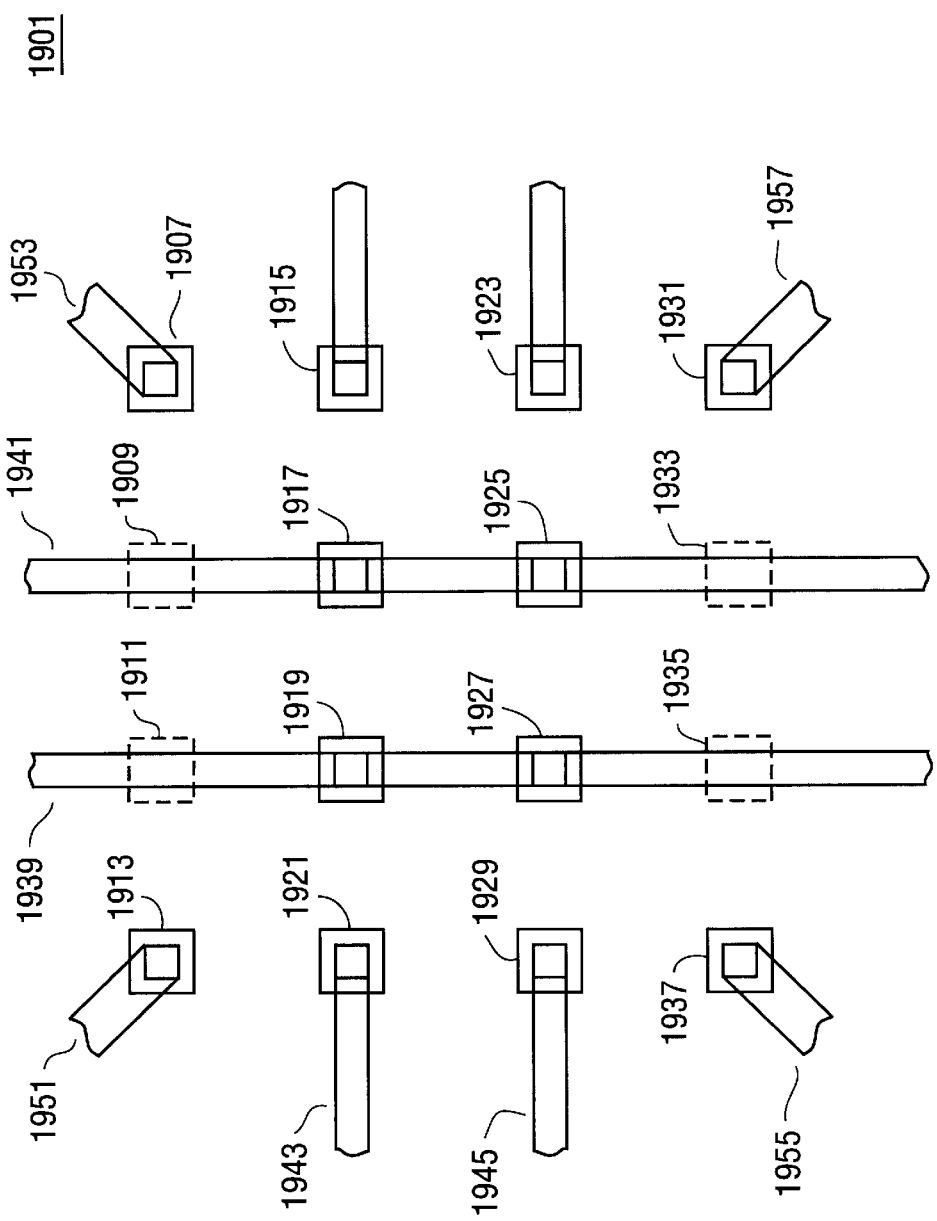
FIG. 19 is an illustration of still another embodiment of a substrate of an active matrix display having a plurality of pixels, row select lines and analog select lines in accordance with the teachings of the present invention.

FIG. 19 is an illustration of one embodiment of a receptor site 1901 of the substrate of an electronic device. In the embodiment illustrated FIG. 19, the electronic device is an active matrix display. As shown in FIG. 19, receptor site 1501 includes interface pads 1907, 1913, 1915, 1917, 1919, 1921, 1923, 1925, 1927, 1929, 1931 and 1937. In one embodiment, a pixel is coupled to interface pad 1907 through connection 1953 and to interface pad 1931 through connection 1957. Another pixel is coupled to interface pad 1913 through connection 1951 and to interface pad 1937 through connection 1955.

In the embodiment illustrated in FIG. 19, receptor sites 1901 is compatible with the integrated circuit die discussed above with respect to FIGS. 17 and 18. For example, a plurality of integrated circuit dice having the schematics of integrated circuit die 1801 may be mounted into receptor site 1901 in any one of the above discussed plurality of orientations to enable the active matrix display of receptor site 1501 to function properly.

As shown in FIG. 19, a digital row select line 1943 is coupled to be received by interface pads 1921. In one embodiment, when integrated circuit die 1801 is mounted in receptor site 1901, interface pad 1915 is coupled to interface pad 1921 through a crossover connection. As shown in FIG. 19, a digital row select line 1945 is coupled to be received by interface pad 1929. In one embodiment, when integrated circuit die 1801 is mounted in receptor site 1901, interface pad 1923 is coupled to interface pad 1929 through a crossover connection. As shown in FIG. 19, an analog line 1939 is coupled to interface pads 1919 and 1927. Note that in this embodiment, analog line 1939 is not coupled to region 1911 and region 1935. An analog line 1941 is coupled to interface pads 1917 and 1925. Note that in this embodiment, analog line 1941 is not coupled to region 1909 and region 1933.

In the embodiment illustrated in FIG. 19, analog line 1939 carries analog pixel information to drive pixels coupled to interface pads 1913 and 1937, which are selected by signals carried on digital row select lines 1943 and 1945. Analog line 1941 carries analog pixel information to drive pixels coupled to interface pads 1907 and 1931, which are selected by signals carried on digital row select lines 1943 and 1945.

In the foregoing detailed description, the method and apparatus of the present invention has been described with reference to specific exemplary embodiments thereof. However, it will be evident that various modifications and changes may be made thereto without departing from the broader spirit and scope of the present invention. The present specification and figures are accordingly to be regarded as illustrative rather than restrictive.

What is claimed is:

1. An integrated circuit device, comprising:
   a substrate; and
   a plurality of functionally symmetric interface pads coupling integrated circuitry of an integrated circuit device to a receptor site of an electronic device, the receptor site having a three dimensional physical shape having a depth, the integrated circuit die having the three dimensional physical shape to be received within the receptor site, the plurality of interface pads arranged in the substrate such that the electronic device operates with the integrated circuit die mounted to the receptor site in any one of a plurality of orientations relative to the receptor site.

2. The integrated circuit device of claim 1 wherein the integrated circuit die has the three dimensional physical shape allowing the integrated circuit die to be mounted to the receptor site in said any one of the plurality of orientations relative to the receptor site.

3. The integrated circuit device of claim 1 wherein each one of the plurality of interface pads provides a predetermined function for the electronic device independent of the plurality of orientations relative to the receptor site in which the integrated circuit die is mounted to the receptor site.

4. The integrated circuit device of claim 1 wherein the substrate comprises silicon.

5. The integrated circuit device of claim 1 wherein the integrated circuit die has M-fold symmetry and an internal layout of the integrated circuit die has N-fold symmetry, wherein M does not equal N.

6. The integrated circuit device of claim 1 wherein each one of the plurality of interface pads comprise a via coupled to an integrated circuit disposed within the integrated circuit die.

7. The integrated circuit device of claim 1 wherein the integrated circuit comprises a plurality of integrated circuit devices coupled between each one of the plurality of interface pads.

8. The integrated circuit device of claim 1 wherein a first signal of the electronic device coupled to a first one of the plurality of interface pads is generated at a second one of the plurality of interface pads in response to a second signal of the electronic device coupled to a third one of the interface pads.

9. The integrated circuit device of claim 1 wherein a first signal of the electronic device coupled to a first one of the plurality of interface pads is generated at a second one of the plurality of interface pads in response to second and third signals of the electronic device coupled to third and fourth ones of the plurality of interface pads, respectively.

10. The integrated circuit device of claim 1 wherein the substrate is selectively coupled to a first one of the plurality of interface pads when the first one of the plurality of interface pads is at or below a first potential so as to maintain the substrate at or below the first potential.

11. The integrated circuit device of claim 1 wherein the substrate is selectively coupled to a first one of the plurality of interface pads in response to a signal coupled to a second one of the plurality of interface pads so as to maintain the substrate at or below a first potential.

12. A method of operating an electronic device, the method comprising:

providing an integrated circuit die having a plurality of interface pads physically arranged in a substrate of the integrated circuit die in functionally symmetric pattern to couple integrated circuitry of the integrated circuit die to a receptor site of the electronic device, the receptor site having a three dimensional physical shape having a depth, the integrated circuit die having the three dimensional physical shape to be received within the receptor site; and mounting the integrated circuit die to the receptor site in any one of a plurality of orientations relative to the receptor site.

13. The method described in claim 12 further comprising shaping the integrated circuit die and the receptor site to the three dimensional physical shape to allow the integrated circuit die to be mounted to the receptor site in said any one of the plurality of orientations relative to the receptor site.

14. The method described in claim 12 further comprising laying out an integrated circuit disposed within the integrated circuit die with different symmetry relative to the integrated circuit die.

15. The method described in claim 12 further comprising coupling an integrated circuit disposed within the integrated circuit die to the electronic device through a plurality of vias, the plurality of vias included in the plurality of interface pads.

16. The method described in claim 12 further comprising driving a first signal onto a first node of the electronic device in response to a second signal at a second node of the electronic device and a third signal at a third node of the electronic device, the first, second and third nodes of the electronic device coupled to first, second and third ones of the plurality of interface pads of the integrated circuit die, respectively, when the integrated circuit die is mounted to the receptor site in said any one of the plurality of orientations.

17. The method described in claim 16 wherein the first signal is the second signal.

18. The method described in claim 12 further comprising selectively coupling the substrate of the integrated circuit die to one of the plurality interface pads when the interface pad is at the first potential so as to maintain the substrate of the integrated circuit die at the first potential.

19. The method described in claim 12 further comprising selectively coupling the substrate of the integrated circuit die to one of the plurality of interface pads when the one of the plurality of interface pad is at a first potential so as to maintain the substrate of the integrated circuit die at the first potential.

20. The method described in claim 12 further comprising selectively coupling the substrate of the integrated circuit die to one of the plurality of interface pads when another one of the plurality of interface pads is at a second potential so as to maintain the substrate of the integrated circuit die at the first potential.

21. An electronic device, comprising:

a receptor site in a substrate of the electronic device, the receptor site including a plurality of receptor interface pads, the receptor site having a three dimensional physical shape having a depth;

an integrated circuit die having the three dimensional physical shape to be received within the receptor site, the integrated circuit die having a plurality of die interface pads to couple integrated circuitry of the integrated circuit die to the receptor site, the plurality of die interface pads and receptor interface pads arranged in a mutually functionally symmetric pattern such that the electronic device operates with the plurality of die interface pads engaged with the plurality of receptor interface pads in any one of a plurality of orientations relative to the receptor site.

22. The electronic device of claim 21 wherein the receptor site and the integrated circuit die have mutually compatible three dimensional physical shapes to allow the integrated circuit die to be mounted to the receptor site in said any one of the plurality of orientations relative to the receptor site.

23. The electronic device of claim 21 wherein each one of the plurality of die interface pads provides a predetermined function for the electronic device independent of the plurality of orientations relative to the receptor site in which the plurality of die interface pads are engaged with the plurality of receptor interface pads.

24. The electronic device of claim 21 wherein the integrated circuit die has M-fold symmetry and an internal layout of the integrated circuit die has N-fold symmetry, wherein M does not equal N.

25. The electronic device of claim 21 wherein the integrated circuit die includes a switch circuit to switch a first signal in the electronic device in response to a second signal of the electronic device.

26. The electronic device of claim 21 wherein the integrated circuit die includes a memory circuit to sustain a first signal in the electronic device in response to a second signal.

27. The integrated circuit device of claim 1 wherein the three dimensional physical shape includes a tapered angle.

28. The integrated circuit device of claim 27 wherein the integrated circuit die has a trapezoidal cross section.

29. An integrated circuit die, comprising:

a substrate; and a plurality of functionally symmetric interface pads coupling integrated circuitry of an integrated circuit die to a receptor site of an electronic device, the plurality of interface pads having a rotationally symmetric arrangement in the substrate such that the electronic device operates with the integrated circuit die mounted to the receptor site in any one of a plurality of N rotational orientations relative to the receptor site, wherein an internal layout of the integrated circuit die is not functionally symmetric over the plurality of N rotational orientations.

30. The integrated circuit device of claim 29 wherein the integrated circuit die has a physical shape that allows the integrated circuit die to be mounted to the receptor site in said any one of the plurality of orientations relative to the receptor site.

31. The integrated circuit device of claim 29 wherein each one of the plurality of interface pads provides a predetermined function for the electronic device independent of the plurality of N rotational orientations relative to the receptor site in which the integrated circuit die is mounted to the receptor site.

32. The integrated circuit device of claim 29 wherein the substrate comprises silicon.

33. The integrated circuit device of claim 29 wherein the integrated circuit die has M-fold symmetry and the internal layout of the integrated circuit die has N-fold symmetry, wherein M does not equal N.

34. The integrated circuit device of claim 29 wherein each one of the plurality of interface pads comprise a via coupled to an integrated circuit disposed within the integrated circuit die.

35. The integrated circuit device of claim 29 wherein the integrated circuit comprises a plurality of integrated circuit dies coupled between each one of the plurality of interface pads.

36. The integrated circuit device of claim 29 wherein a first signal of the electronic device coupled to a first one of the plurality of interface pads is generated at a second one of the plurality of interface pads in response to a second signal of the electronic device coupled to a third one of the interface pads.

37. The integrated circuit device of claim 29 wherein a first signal of the electronic device coupled to a first one of the plurality of interface pads is generated at a second one of the plurality of interface pads in response to second and third signals of the electronic device coupled to third and fourth ones of the plurality of interface pads, respectively.

38. The integrated circuit device of claim 29 wherein the substrate is selectively coupled to a first one of the plurality of interface pads when the first one of the plurality of interface pads is at or below a first potential so as to maintain the substrate at or below the first potential.

39. The integrated circuit device of claim 29 wherein the substrate is selectively coupled to a first one of the plurality of interface pads in response to a signal coupled to a second one of the plurality of interface pads so as to maintain the substrate at or below a first potential.

40. A method of operating an electronic device, the method comprising:
providing an integrated circuit die having a plurality of interface pads physically arranged in a substrate of the integrated circuit die in functionally symmetric pattern over a plurality of N rotational orientations to couple integrated circuitry of the integrated circuit die to a receptor site of the electronic device, wherein an internal layout of the integrated circuit die is not functionally symmetric over the plurality of N rotational orientations; and
mounting the integrated circuit die to the receptor site in any one of a plurality of N rotational orientations relative to the receptor site.

41. The method described in claim 40 further comprising shaping the integrated circuit die and the receptor site to allow the integrated circuit die to be mounted to the receptor site in said any one of the plurality of N rotational orientations relative to the receptor site.

42. The method described in claim 40 further comprising laying out an integrated circuit disposed within the integrated circuit die without functional symmetry over the plurality of N rotational orientations.

43. The method described in claim 40 further comprising coupling an integrated circuit disposed within the integrated circuit die to the electronic device through a plurality of vias, the plurality of vias included in the plurality of interface pads.

44. The method described in claim 40 further comprising driving a first signal onto a first node of the electronic device in response to a second signal at a second node of the electronic device and a third signal at a third node of the electronic device, the first, second and third nodes of the electronic device coupled to first, second and third ones of the plurality of interface pads of the integrated circuit die, respectively, when the integrated circuit die is mounted to the receptor site in said any one of the plurality of N rotational orientations.

45. The method described in claim 44 wherein the first signal is the second signal.

46. The method described in claim 40 further comprising selectively coupling the substrate of the integrated circuit die to one of the plurality interface pads when the interface pad is at the first potential so as to maintain the substrate of the integrated circuit die at the first potential.

47. The method described in claim 40 further comprising selectively coupling the substrate of the integrated circuit die to one of the plurality of interface pads when the one of the plurality of interface pads is at a first potential so as to maintain the substrate of the integrated circuit die at the first potential.

48. The method described in claim 40 further comprising selectively coupling the substrate of the integrated circuit die to one of the plurality of interface pads when another one of the plurality of interface pads is at a second potential so as to maintain the substrate of the integrated circuit die at the first potential.

49. An electronic device, comprising:
a receptor site in a substrate of the electronic device, the receptor site including a plurality of receptor interface pads;
an integrated circuit die having a plurality of die interface pads to couple integrated circuitry of the integrated circuit die to the receptor site, the plurality of die interface pads and receptor interface pads arranged in a mutually functionally symmetric pattern over a plurality of N rotational orientations such that the electronic device operates with the plurality of die interface pads engaged with the plurality of receptor interface pads in any one of the plurality of N rotational orientations, wherein an internal layout of the integrated circuit die is not functionally symmetric over the plurality of N rotational orientations.

50. The electronic device of claim 49 wherein the receptor site and the integrated circuit die have mutually compatible physical shapes to allow the integrated circuit die to be mounted to the receptor site in said any one of the plurality of orientations relative to the receptor site.

51. The electronic device of claim 49 wherein each one of the plurality of die interface pads provides a predetermined function for the electronic device independent of the plurality of orientations relative to the receptor site in which the plurality of die interface pads are engaged with the plurality of receptor interface pads.

52. The electronic device of claim 49 wherein the integrated circuit die has M-fold symmetry and an internal layout of the integrated circuit die has N-fold symmetry, wherein M does not equal N.

53. The electronic device of claim 49 wherein the integrated circuit die includes a switch circuit to switch a first signal in the electronic device in response to a second signal of the electronic device.

54. The electronic device of claim 49 wherein the integrated circuit die includes a memory circuit to sustain a first signal in the electronic device in response to a second signal.

55. An integrated circuit device, comprising:
a substrate; and
a plurality of functionally symmetric interface pads coupling integrated circuitry of an integrated circuit die to a receptor site of an electronic device, the plurality of interface pads arranged in the substrate such that the electronic device operates with the integrated circuit die self-aligned and mounted to the receptor site in any one of a plurality of orientations relative to the receptor site.

56. The integrated circuit die of claim 55 wherein the integrated circuit die has a physical shape that allows the integrated circuit die to be mounted to the receptor she in said any one of the plurality of orientations relative to the receptor site.

57. The integrated circuit die of claim 55 wherein each one of the plurality of interface pads provides a predetermined function for the electronic device independent of the plurality of orientations relative to the receptor site in which the integrated circuit die is mounted to the receptor site.

58. The integrated circuit die of claim 55 wherein the substrate comprises silicon.

59. The integrated circuit die of claim 55 wherein the integrated circuit die has M-fold symmetry and an internal layout of the integrated circuit die has N-fold symmetry, wherein M does not equal N.

60. The integrated circuit die of claim 55 wherein each one of the plurality of interface pads comprise a via coupled to an integrated circuit disposed within the integrated circuit die.

61. The integrated circuit die of claim 55 wherein the integrated circuit comprises a plurality of integrated circuit dies coupled between each one of the plurality of interface pads.

62. The integrated circuit die of claim 55 wherein a first signal of the electronic device coupled to a first one of the plurality of interface pads is generated at a second one of the plurality of interface pads in response to a second signal of the electronic device coupled to a third one of the interface pads.

63. The integrated circuit die of claim 55 wherein a first signal of the electronic device coupled to a first one of the plurality of interface pads is generated at a second one of the plurality of interface pads in response to second and third signals of the electronic device coupled to third and fourth ones of the plurality of interface pads, respectively.

64. The integrated circuit die of claim 55 wherein the substrate is selectively coupled to a first one of the plurality of interface pads when the first one of the plurality of interface pads is at or below a first potential so as to maintain the substrate at or below the first potential.

65. The integrated circuit die of claim 55 wherein the substrate is selectively coupled to a first one of the plurality of interface pads in response to a signal coupled to a second one of the plurality of interface pads so as to maintain the substrate at or below a first potential.

66. A method of operating an electronic device, the method comprising the steps of:
providing an integrated circuit die having a plurality of interface pads physically arranged in a substrate of the integrated circuit die in functionally symmetric pattern to couple integrated circuitry of the integrated circuit die to a receptor site of the electronic device;
self-aligning the integrated circuit die to the receptor site in any one of a plurality of orientations relative to the receptor site; and
mounting the integrated circuit die to the receptor site in said any one of the plurality of orientations relative to the receptor site.

67. The method described in claim 66 further comprising shaping the integrated circuit die and the receptor site to allow the integrated circuit die to be self-aligned and mounted to the receptor site in said any one of the plurality of orientations relative to the receptor site.

68. The method described in claim 66 further comprising laying out an integrated circuit disposed within the integrated circuit die with different symmetry relative to the integrated circuit die.

69. The method described in claim 65 further comprising coupling an integrated circuit disposed within the integrated circuit die to the electronic device through a plurality of vias, the plurality of vias included in the plurality of interface pads.

70. The method described in claim 66 further comprising driving a first signal onto a first node of the electronic device in response to a second signal at a second node of the electronic device and a third signal at a third node of the electronic device, the first, second and third nodes of the electronic device coupled to first, second and third ones of the plurality of interface pads of the integrated circuit die, respectively, when the integrated circuit die is mounted to the receptor site in said any one of the plurality of orientations.

71. The method described in claim 70 wherein the first signal is the second signal.

72. The method described in claim 66 further comprising selectively coupling the substrate of the integrated circuit die to one of the plurality interface pads when the interface pad is at the first potential so as to maintain the substrate of the integrated circuit die at the first potential.

73. The method described in claim 66 further comprising selectively coupling the substrate of the integrated circuit die to one of the plurality of interface pads when the one of the plurality of interface pads is at a first potential so as to maintain the substrate of the integrated circuit die at the first potential.

74. The method described in claim 66 including the additional step of selectively coupling the substrate of the integrated circuit die to one of the plurality of interface pads when another one of the plurality of interface pads is at a second potential so as to maintain the substrate of the integrated circuit die at the first potential.

75. An electronic device, comprising:
a receptor site in a substrate of the electronic device, the receptor site including a plurality of receptor interface pads;
an integrated circuit die having a plurality of die interface pads to couple integrated circuitry of the integrated circuit die to the receptor site, the plurality of die interface pads and receptor interface pads arranged in a mutually functionally symmetric pattern such that the electronic device operates with the plurality of die interface pads engaged with the plurality of receptor interface pads in any one of a plurality of orientations relative to the receptor site, the integrated circuit die self-aligned with the receptor site.

76. The electronic device of claim 75 wherein the receptor site and the integrated circuit die have mutually compatible physical shapes to allow the integrated circuit die to be self-aligned and mounted to the receptor site in said any one of the plurality of orientations relative to the receptor site.

77. The electronic device of claim 75 wherein each one of the plurality of die interface pads provides a predetermined function for the electronic device independent of the plurality of orientations relative to the receptor site in which the plurality of die interface pads are engaged with the plurality of receptor interface pads.

78. The electronic device of claim 75 wherein the integrated circuit die has M-fold symmetry and an internal layout of the integrated circuit die has N-fold symmetry, wherein M does not equal N.

79. The electronic device of claim 75 wherein the integrated circuit die includes a switch circuit to switch a first signal in the electronic device in response to a second signal of the electronic device.

80. The electronic device of claim 75 wherein the integrated circuit die includes a memory circuit to sustain a first signal in the electronic device in response to a second signal.

* * * * *